(12) United States Patent
Oh

(10) Patent No.: US 10,930,587 B2
(45) Date of Patent: Feb. 23, 2021

(54) SEMICONDUCTOR MEMORY DEVICE

(71) Applicant: SK hynix Inc., Gyeonggi-do (KR)

(72) Inventor: Sung-Lae Oh, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/570,412

(22) Filed: Sep. 13, 2019

(65) Prior Publication Data

US 2020/0227347 A1   Jul. 16, 2020

(30) Foreign Application Priority Data

Jan. 16, 2019   (KR) .......................... 10-2019-0005521

(51) Int. Cl.

| | | |
|---|---|---|
| *H01L 23/522* | (2006.01) | |
| *H01L 27/11519* | (2017.01) | |
| *H01L 27/11524* | (2017.01) | |
| *H01L 27/11556* | (2017.01) | |
| *H01L 27/11565* | (2017.01) | |
| *H01L 27/1157* | (2017.01) | |
| *H01L 27/11582* | (2017.01) | |

(52) U.S. Cl.
CPC ...... *H01L 23/5226* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC .......... H01L 23/5226; H01L 27/11582; H01L 27/1157; H01L 27/11519; H01L 27/11556; H01L 27/11524; H01L 27/11565

USPC ......................................................... 257/314
See application file for complete search history.

(56) References Cited

U.S. PATENT DOCUMENTS

| | | | | |
|---|---|---|---|---|
| 2012/0061744 A1* | 3/2012 | Hwang | ............. | H01L 27/11573 257/324 |
| 2015/0287710 A1* | 10/2015 | Yun | ..................... | H01L 23/5226 257/314 |

FOREIGN PATENT DOCUMENTS

| | | |
|---|---|---|
| KR | 10-2012-0105209 | 9/2012 |
| KR | 10-2016-0128127 | 11/2019 |

* cited by examiner

*Primary Examiner* — Caleen O Sullivan
(74) *Attorney, Agent, or Firm* — IP & T Group LLP

(57) ABSTRACT

A semiconductor memory device includes a substrate defined with a cell array region and a connection region which extends in a first direction from the cell array region; an electrode structure including a bottom electrode structure which includes plurality of bottom electrodes stacked on the substrate to be separated from one another and a top electrode structure which includes plurality of top electrodes stacked on the bottom electrode structure to be separated from one another and has a stepped structure which includes plurality of stepping surfaces, in the connection region; and plurality of recess holes formed to a first depth from stepping surfaces of the stepped structure, and having bottom surfaces which expose the bottom electrode structure, wherein the first depth is substantially same as a height of the top electrode structure, and distances of the bottom surfaces of the recess holes from the substrate are different from one another.

18 Claims, 33 Drawing Sheets

FIG.1
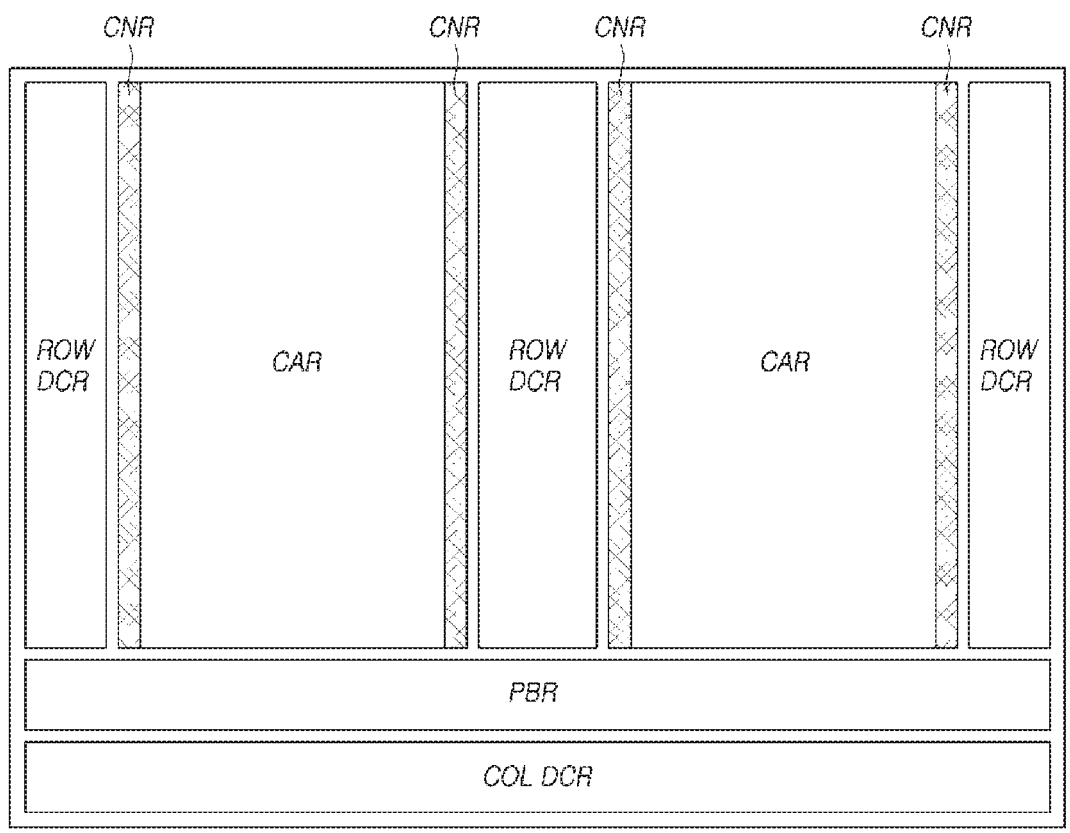
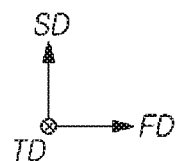

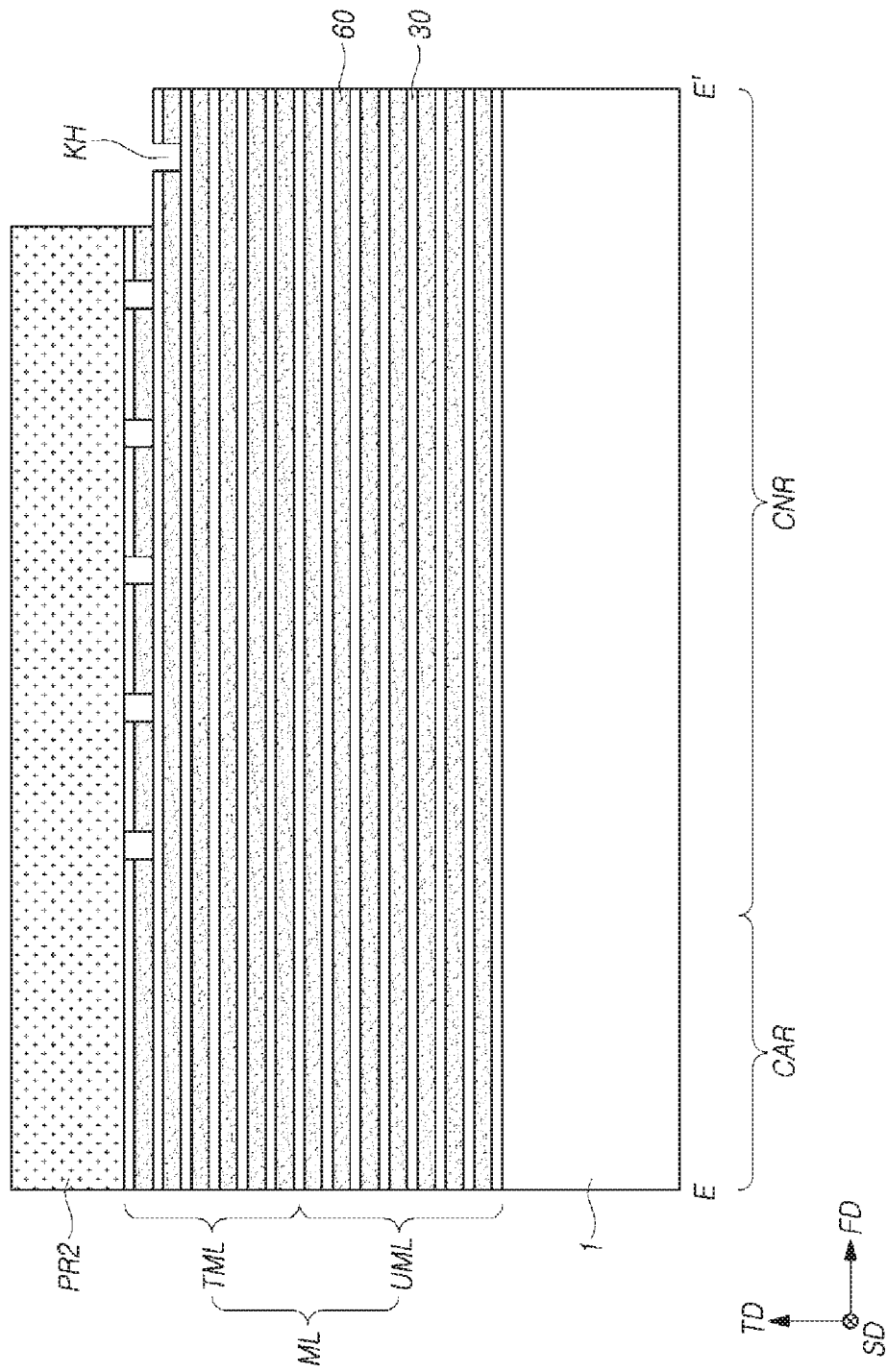

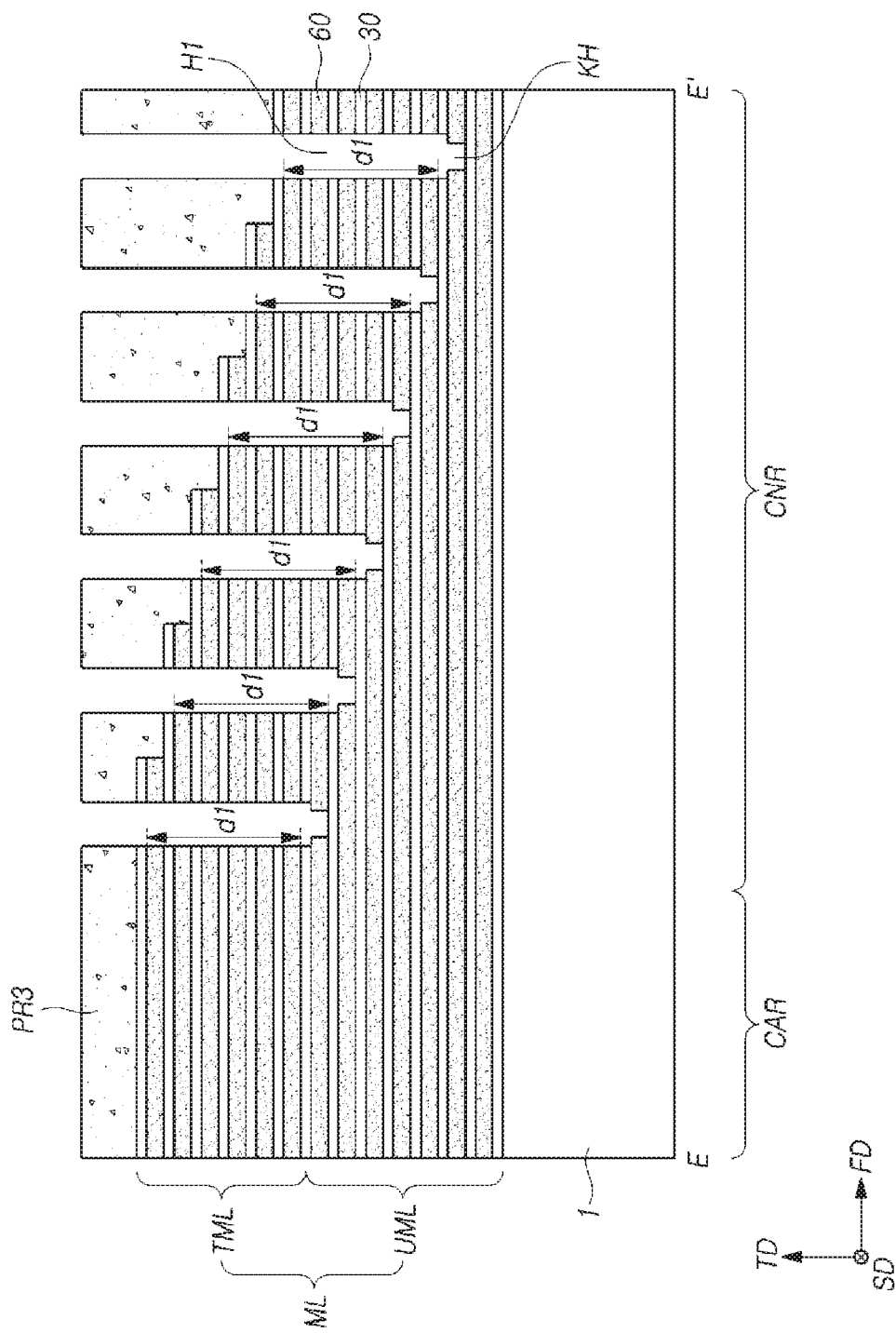

SEMICONDUCTOR MEMORY DEVICE

CROSS-REFERENCE TO RELATED APPLICATION

The present application claims priority under 35 U.S.C. § 119 (a) to Korean Patent Application No. 10-2019-0005521 filed in the Korean Intellectual Property Office on Jan. 16, 2019, which is incorporated herein by reference in its entirety.

BACKGROUND

1. Technical Field

Various embodiments generally relate to a semiconductor memory device and, more particularly, to a semiconductor memory device of a three-dimensional structure.

2. Related Art

To meet excellent performance and low price that consumers demand, it is required to increase the degree of integration of semiconductor devices. In the case of a two-dimensional or planar semiconductor memory device, since the degree of integration thereof is mainly determined by the area occupied by a unit memory cell, the degree of integration is greatly influenced by the level of fine pattern forming techniques. However, because generally very expensive equipment are needed for the fine pattern formation, the degree of integration of a two-dimensional semiconductor memory device may be limited by cost considerations although technically further improvements may be possible. As an alternative, a semiconductor memory device of a three-dimensional structure having three-dimensionally arranged memory cells has been proposed.

SUMMARY

In an embodiment, a semiconductor memory device may include: a substrate defined with a cell array region and a connection region which extends in a first direction from the cell array region; an electrode structure including a bottom electrode structure which includes a plurality of bottom electrodes stacked on the substrate to be separated from one another and a top electrode structure which includes a plurality of top electrodes stacked on the bottom electrode structure to be separated from one another and has a stepped structure which includes a plurality of stepping surfaces in the connection region; and a plurality of recess holes formed to a first depth from the stepping surfaces, and having bottom surfaces which expose the bottom electrode structure. The first depth may be the substantially same as a height of the top electrode structure, and distances of the bottom surfaces of the recess holes from the substrate may be different from one another.

In an embodiment, a semiconductor memory device may include: a substrate defined with a cell array region and a connection region which extends in a first direction from the cell array region; a first bottom electrode structure including a plurality of first bottom electrodes which are stacked on the substrate to be separated from one another; a second bottom electrode structure including a plurality of second bottom electrodes which are stacked on the first bottom electrode structure to be separated from one another; a top electrode structure including a plurality of top electrodes which are stacked on the second bottom electrode structure to be separated from one another, and having a stepped structure which includes a plurality of stepping surfaces, in the connection region; a plurality of first recess holes formed to a first depth from the stepping surfaces, and having bottom surfaces which expose the second bottom electrode structure; and a plurality of second recess holes formed to a second depth from the stepping surfaces, and having bottom surfaces which expose the first bottom electrode structure. The first depth may be the substantially same as a height of the top electrode structure, the second depth may be the substantially equal to sum of the height of the top electrode structure and a height of the second bottom electrode structure, and distances of bottom surfaces of the first and second recess holes from the substrate may be different from one another.

BRIEF DESCRIPTION OF THE DRAWINGS

FIG. 1 is a diagram illustrating a semiconductor memory device in accordance with an embodiment of the disclosure.

FIGS. 12A to 18A are top views illustrating the semiconductor memory device in accordance with the embodiment of the disclosure according to a manufacturing sequence.

FIGS. 12B to 18B are cross-sectional views taken along the line E-E' of FIGS. 12A to 18A.

DETAILED DESCRIPTION

Figure 2:
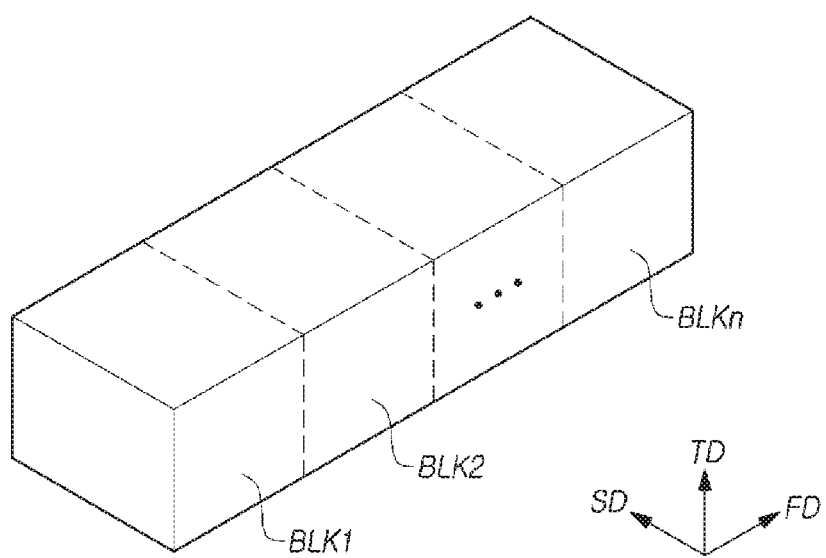
FIG. 2 is a block diagram schematically illustrating a representation of an example of a memory cell array of the semiconductor memory device in accordance with an embodiment of the disclosure.

Advantages and features of the disclosure and methods to achieve them will become apparent from the descriptions of exemplary embodiments herein below with reference to the accompanying drawings. However, the disclosure is not limited to the exemplary embodiments disclosed herein but may be implemented in various different ways. The exemplary embodiments are provided for making the disclosure of the disclosure thorough and for fully conveying the scope of the disclosure to those skilled in the art to which the disclosure pertains. Therefore, the exemplary embodiments are not intended to limit the scope of the invention disclosed in the present application which is defined by the accompanied claims.

The figures, dimensions, ratios, angles, numbers of elements given in the drawings to describe embodiments of the disclosure are merely illustrative and are not limiting. Throughout the specification, like reference numerals refer to like elements. In describing the disclosure, when it is determined that the detailed description of the known related art may obscure the gist of the disclosure, the detailed description thereof will be omitted. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun, e.g. "a," "an," "the," this may include a plural of that noun unless specifically stated otherwise.

Any numerical values for the various elements in the described embodiments of the disclosure should be interpreted as including error margins even without explicit statements. Also, in describing the components of the disclosure, there may be terms used like first, second, A, B, (a), and (b). These are solely for the purpose of differentiating one component from the other but not to imply or suggest the substances, order, sequence or number of the components. Also, elements in embodiments of the disclosure are not limited by these terms. These terms are used to merely distinguish one element from another. Accordingly, as used herein, a first element may be a second element within the technical concepts of the disclosure.

If a component is described as "connected," "coupled" or "linked" to another component, it may mean that the component is not only directly "connected," "coupled" or "linked" but also is indirectly "connected," "coupled" or "linked" via a third component. In describing positional relationship, such as "an element A on an element B," "an element A above an element B," "an element A below an element Bi" and "an element A next to an element B," another element C may be disposed between the elements A and B unless the term "directly" or "immediately" is explicitly used.

Features of various exemplary embodiments of the disclosure may be coupled, combined or separated partially or totally. Technically various interactions and operations are possible. Various exemplary embodiments can be practiced individually or in combination.

Hereinafter, a semiconductor memory device will be described below with reference to the accompanying drawings through various examples of embodiments.

FIG. 1 is a representation of an example of a diagram to assist in the explanation of the schematic configuration of a semiconductor memory device in accordance with an embodiment of the disclosure.

Referring to FIG. 1, a semiconductor memory device may include cell array regions CAR and a peripheral circuit region. The peripheral circuit region may include row decoder regions ROW DCR, a page buffer region PBR, a column decoder region COL DCR and a control circuit region (not shown).

The row decoder regions ROW DCR may be disposed adjacent to the cell array regions CAR in a first direction FD. Connection regions CNR may be disposed between the cell array regions CAR and the row decoder regions ROW DCR. The page buffer region PBR may be disposed adjacent to the cell array regions CAR in a second direction SD. The column decoder region COL DCR may be disposed adjacent to the page buffer region PBR in the second direction SD.

The first direction FD may correspond to an extending direction of word lines or an arrangement direction of bit lines. The second direction SD may be a direction intersecting with the first direction FD and may correspond to an extending direction of bit lines or an arrangement direction of word lines. The first direction FD and the second direction SD may substantially perpendicularly intersect with each other. A third direction TD may correspond to a direction that is perpendicular to a plane extending in the first direction FD and the second direction SD. The third direction TD may be a vertical or substantially vertical direction. In the drawings, a direction indicated by an arrow and a direction opposite thereto represent the same direction.

A memory cell array may be disposed in the cell array region CAR. The memory cell array may include a plurality of memory cells which are arranged three-dimensionally, a plurality of word lines and a plurality of bit lines which are electrically connected with the memory cells.

Row decoders for selecting word lines of a memory cell array may be disposed in each of the row decoder regions ROW DCR, and a wiring structure including contact plugs and wirings which electrically connect the memory cell array and the row decoders may be disposed in each of the connection regions CNR. The row decoders may select one among the word lines of the memory cell array depending on an address information. The row decoders may provide word line voltages to a selected word line and unselected word lines in response to a control signal of a control circuit.

Page buffers for reading the informations stored in memory cells may be disposed in the page buffer region PBR. The page buffers may temporarily store data to be stored in the memory cells or sense data stored in the memory cells, depending on an operation mode. The page buffers may operate as a write driver circuit in a program operation mode, and may operate as a sense amplifier circuit in a read operation mode.

Column decoders which are connected with bit lines of the memory cell array may be disposed in the column decoder region COL DCR. The column decoders may provide data transmission paths between the page buffers and an external device (for example, a memory controller).

FIG. 2 is a block diagram schematically illustrating a representation of an example of a memory cell array of the semiconductor memory device in accordance with an embodiment of the disclosure.

Referring to FIG. 2, a memory cell array may include a plurality of memory blocks BLK1 to BLKn.

While not shown, each of the memory blocks BLK1 to BLKn may include an electrode structure including a plurality of electrodes which are stacked in the third direction TD on a plane extending in the first direction FD and the second direction SD.

The electrode structure may be coupled with a plurality of vertical channels (semiconductor pillars) and thereby configure memory cells which are arranged three-dimensionally. Also, each of the memory blocks BLK1 to BLKn may include bit lines which are electrically connected with memory cells. Each memory cell may be a volatile memory cell which loses data stored therein in the case where power supply is interrupted, or may be a nonvolatile memory cell which retains data stored therein even though power supply is interrupted. While it is described below that a semiconductor memory device is a vertical type NAND flash device, it is to be noted that the technical concepts of the disclosure are not limited thereto.

Figure 3:
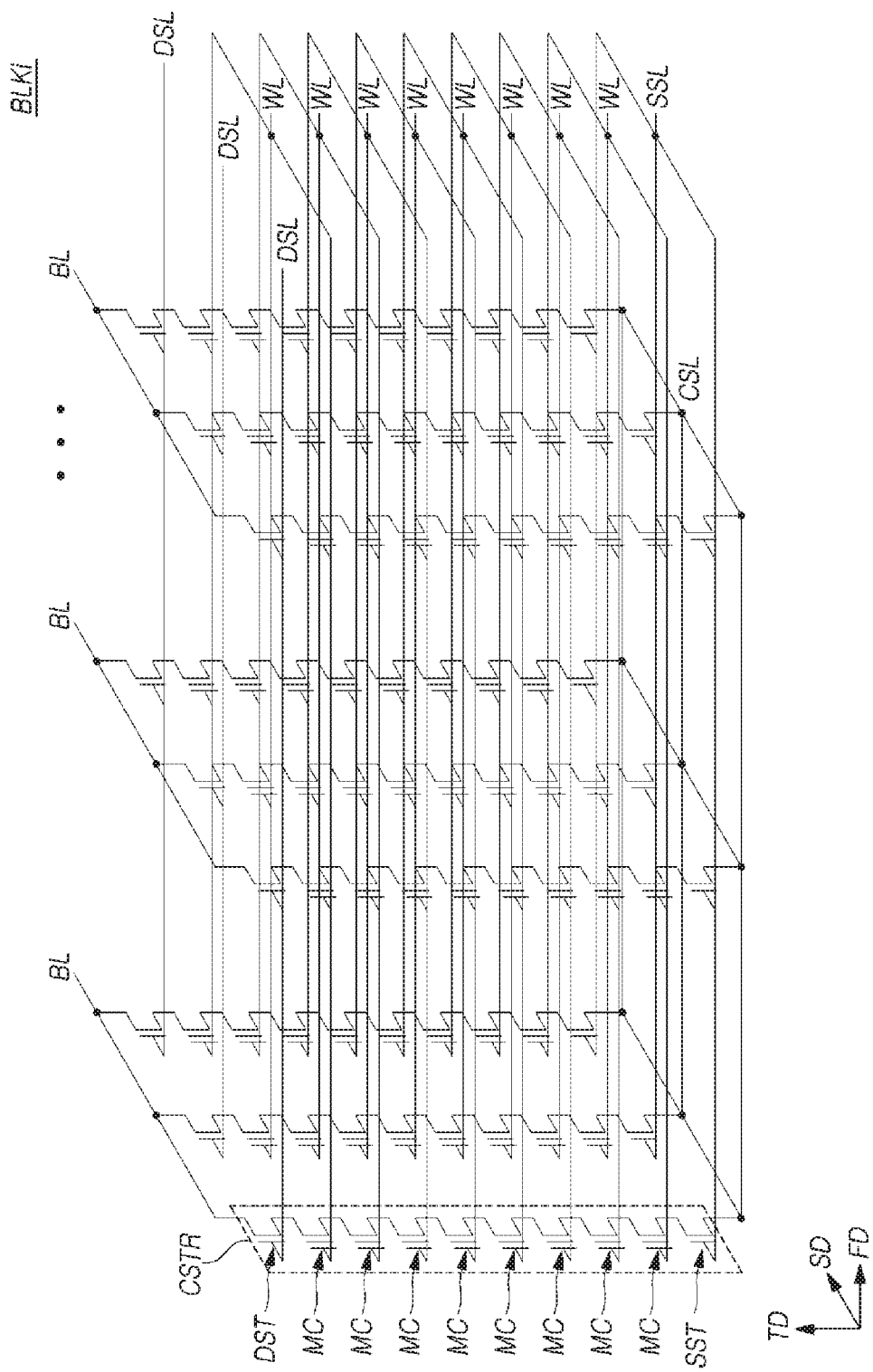
FIG. 3 is an circuit diagram illustrating a memory block BLKi among memory blocks BLK1 to BLKn illustrated in FIG. 2.

FIG. 3 is an equivalent circuit diagram illustrating a memory block BLKi among the memory blocks BLK1 to BLKn illustrated in FIG. 2.

Referring to FIG. 3, the memory block BLKi may include a plurality of cell strings CSTR which are connected between a plurality of bit lines BL and a common source line CSL.

The bit lines BL may extend in the second direction SD, and may be arranged in the first direction FD. A plurality of cell strings CSTR may be connected in parallel to each of the bit lines BL. The cell strings CSTR may be connected in common to the common source line CSL. In this case, the plurality of cell strings CSTR may be connected between the plurality of bit lines BL and one common source line CSL.

Each of the cell strings CSTR may include a drain select transistor DST which is connected to a bit line BL, a source select transistor SST which is connected to the common source line CSL, and a plurality of memory cells MC which are connected between the drain select transistor DST and the source select transistor SST. The drain select transistor DST, the memory cells MC and the source select transistor SST may be connected in series in the third direction TD.

Drain select lines DSL, a plurality of word lines WL and a source select line SSL which extend in the first direction FD may be arranged in the third direction TD between the bit lines BL and the common source line CSL. The drain select lines DSL may be respectively connected to the gates of corresponding drain select transistors DST. The word lines WL may be respectively connected to the gates of corresponding memory cells MC. The source select line SSL may be connected to the gates of source select transistors SST.

FIGS. 4 to 7 are representations of examples of views to assist in the explanation of an electrode structure of a semiconductor memory device in accordance with an embodiment of the disclosure.

Figure 4:
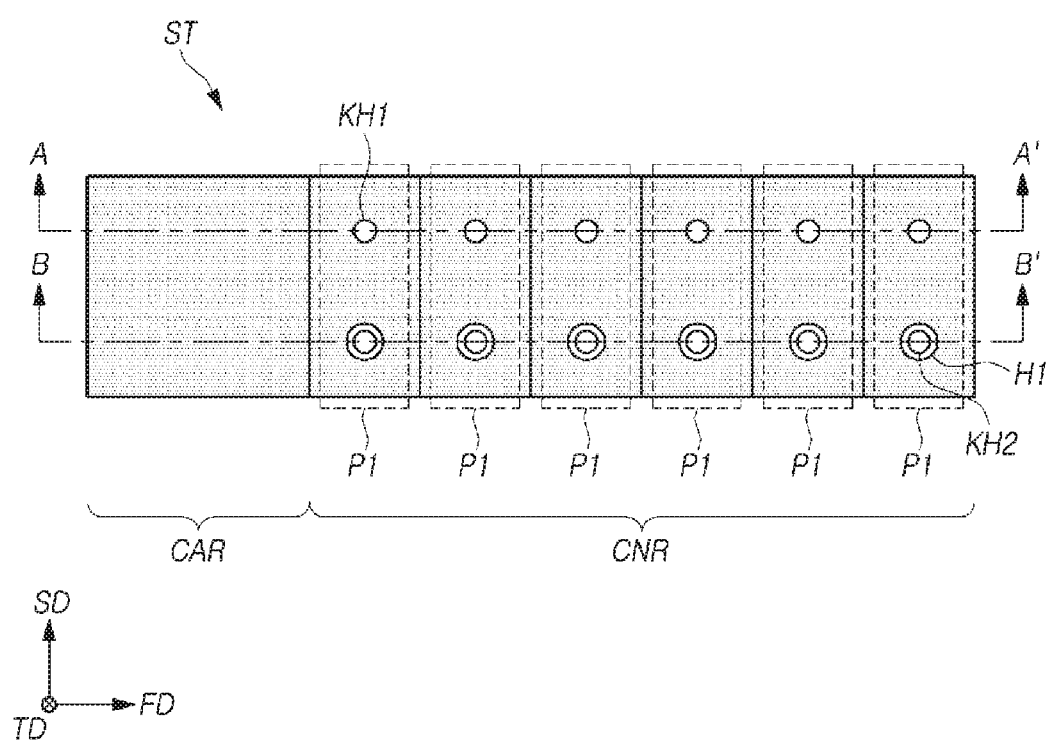
FIG. 4 is a top view illustrating a representation of an example of an electrode structure of a semiconductor memory device in accordance with an embodiment of the disclosure.
Figure 5:
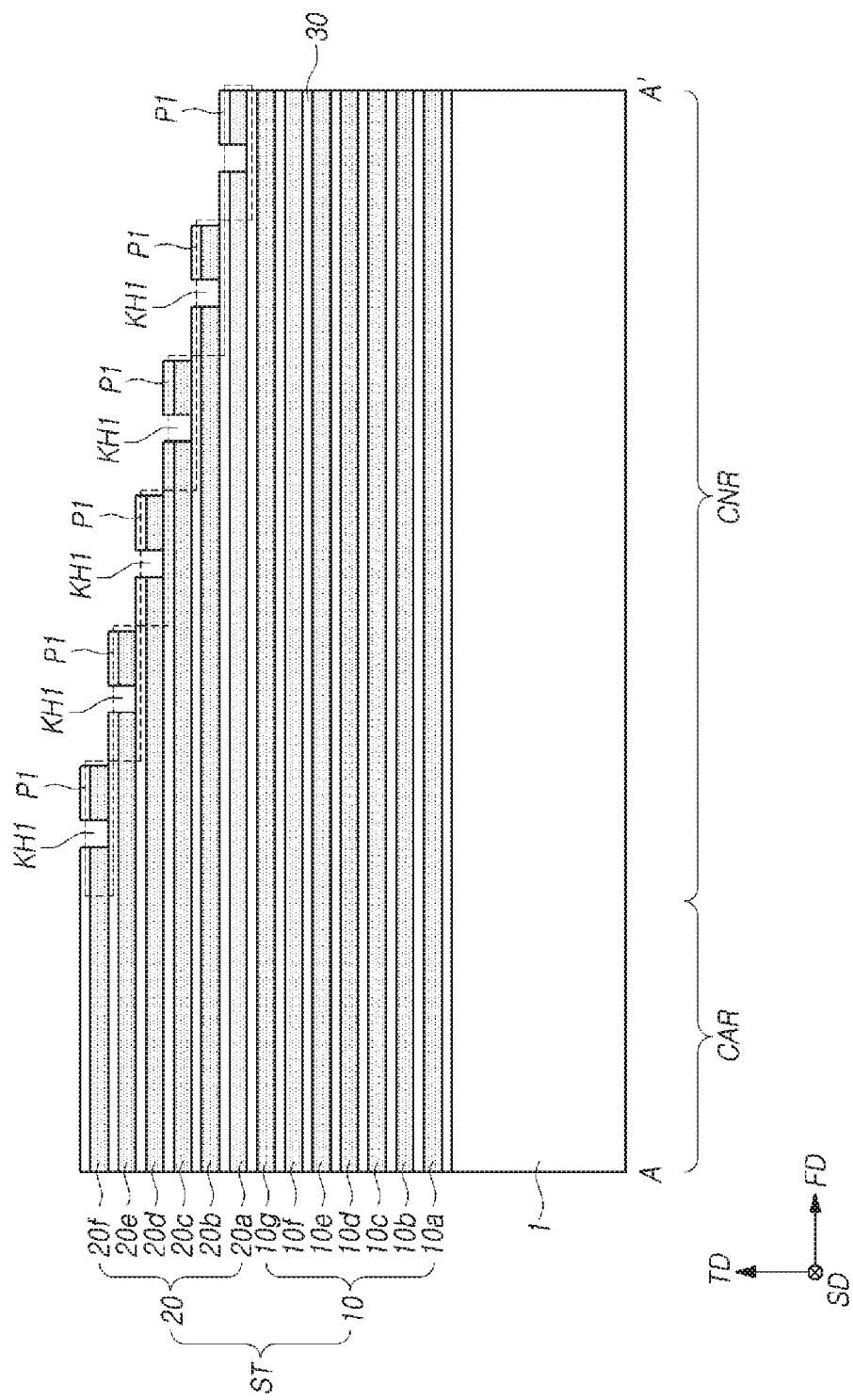
FIG. 5 is a cross-sectional view taken along the line A-A' of FIG. 4.
Figure 6:
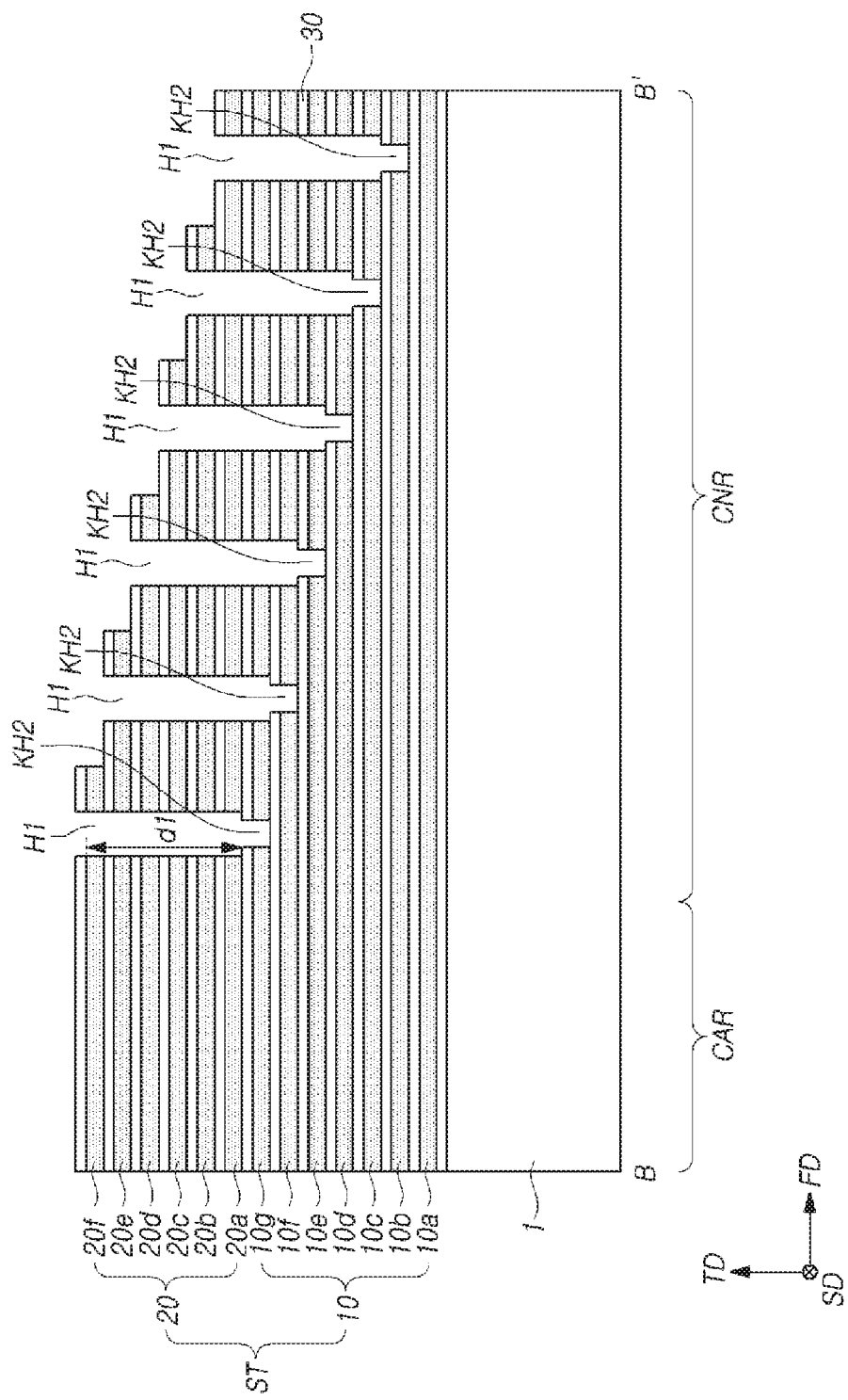
FIG. 6 is a cross-sectional view taken along the line B-B' of FIG. 4.
Figure 7:
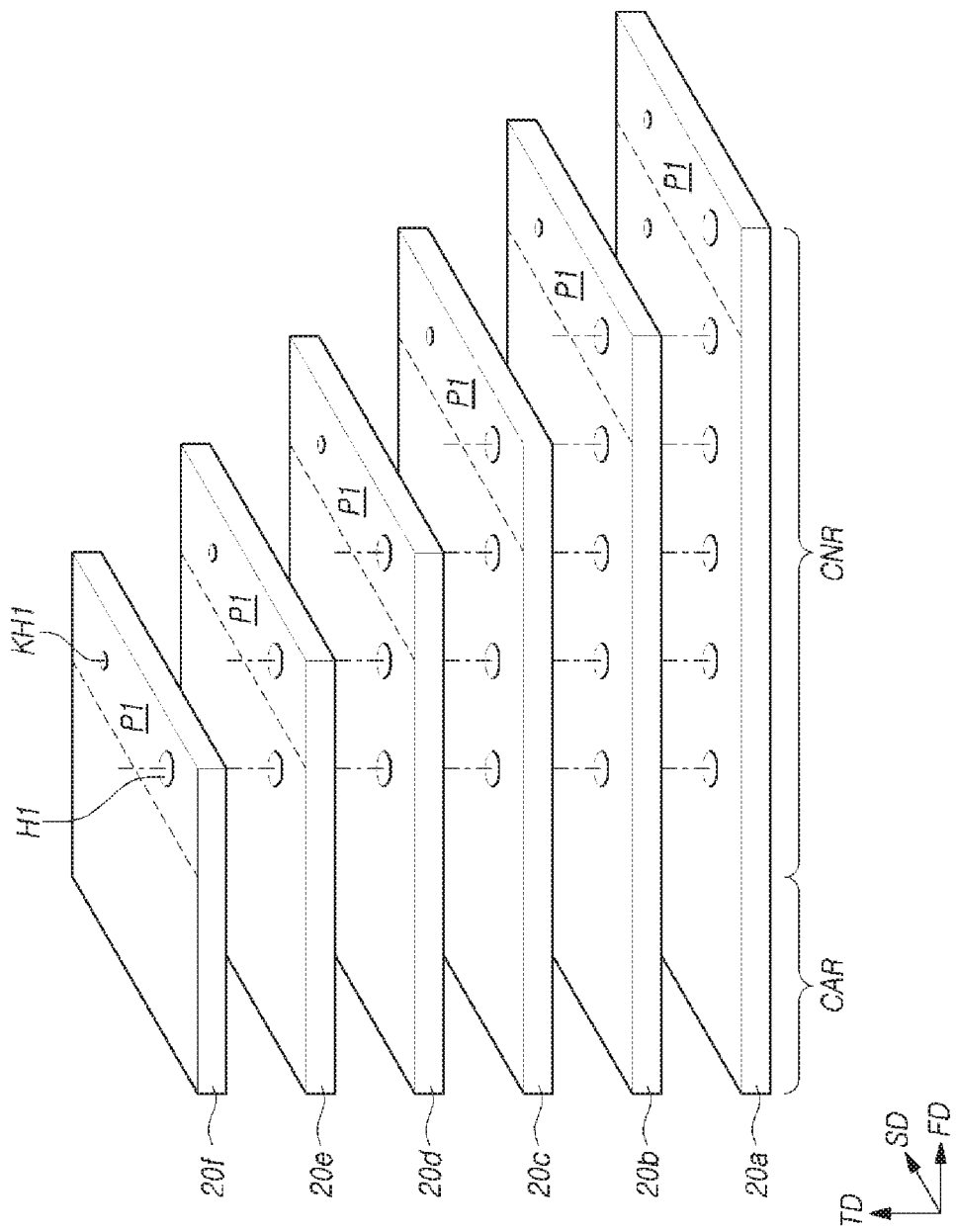
FIG. 7 is an exploded perspective view of top electrodes illustrated in FIG. 4.

In detail, FIG. 4 is a top view illustrating an electrode structure of a semiconductor memory device in accordance with an embodiment of the disclosure, FIG. 5 is a cross-sectional view taken along the line A-A' of FIG. 4, FIG. 6 is a cross-sectional view taken along the line B-B' of FIG. 4, and FIG. 7 is an exploded perspective view of top electrodes illustrated in FIG. 4.

Referring to FIGS. 4 to 7, a substrate 1 or a semiconductor memory device may include a cell array region CAR and a connection region CNR which extends in the first direction FD from the cell array region CAR. For example, the substrate 1 may include at least one among silicon (Si), germanium (Ge), silicon germanium (SiGe), gallium arsenide (GaAs), indium gallium arsenide (InGaAs), aluminum gallium arsenide (AlGaAs) and a compound thereof. The substrate 1 may be a bulk silicon substrate, a silicon-on-insulator (SOI) substrate, a germanium substrate, a germanium-on-insulator (GOI) substrate, a silicon-germanium substrate, or a substrate of an epitaxial thin film obtained by performing selective epitaxial growth (SEG).

An electrode structure ST may be disposed on the substrate 1. The electrode structure ST may extend in the first direction FD from the cell array region CAR to the connection region CNR.

The electrode structure ST may include a bottom electrode structure 10 which is stacked on the substrate 1 and a top electrode structure 20 which is stacked on the bottom electrode structure 10. The bottom electrode structure 10 may include a plurality of bottom electrodes 10a to 10g which are stacked to be separated from one another, and the top electrode structure 20 may include a plurality of top electrodes 20a to 20f which are stacked to be separated from one another. Interlayer dielectric layers 30 may be disposed on and under the bottom electrodes 10a to 10g and the top electrodes 20a to 20f. The bottom electrode structure 10 may include the plurality of bottom electrodes 10a to 10g and a plurality of interlayer dielectric layers 30 which are alternately stacked in the third direction TD, and the top electrode structure 20 may include the plurality of top electrodes 20a to 20f and a plurality of interlayer dielectric layers 30 which are alternately stacked in the third direction TD.

The bottom electrodes 10a to 10g and the top electrodes 20a to 20f may include a conductive material. For example, the bottom electrodes 10a to 10g and the top electrodes 20a to 20f may include at least one selected among a doped semiconductor (e.g., doped silicon, etc.), a metal (e.g., tungsten, copper, aluminum, etc.), a conductive metal nitride (e.g., a titanium nitride, a tantalum nitride, etc.) and a transition metal (e.g., titanium, tantalum, etc.). The interlayer dielectric layers 30 may include a dielectric material. For example, the interlayer dielectric layers 30 may be configured by silicon oxide layers.

In the connection region CNR, each of the top electrodes 20a to 20f may have a top pad region P1 which is exposed by another top electrode positioned thereon. When viewed from the top, the top pad regions P1 of the top electrodes 20a to 20f may be disposed in the first direction FD. The top pad regions P1 of the top electrodes 20a to 20f may be disposed at horizontally and vertically different positions.

The electrode structure ST may have a stepped structure which is provided by the top pad regions P1 of the top electrodes 20a to 20f, in the connection region CNR. The stepped structure may have a step shape which descends in the first direction FD. Due to this fact, in the connection region CNR, the height of the electrode structure ST may decrease as the distance from the cell array region CAR increases.

Each of the top pad regions P1 of the top electrodes 20a to 20f may be covered by the interlayer dielectric layer 30 positioned thereon. The top surfaces of the interlayer dielectric layers 30 which cover the top pad regions P1 may configure stepping surfaces of the stepped structure. The stepping surfaces of the stepped structure may be disposed closer to the substrate 1 as the distances thereof from the cell array region CAR in the first direction FD increase.

In the connection region CNR, the bottom electrodes 10a to 10g may have a non-stepped structure.

A plurality of recess holes H1 may be defined in the electrode structure ST. The recess holes H1 may be formed in the connection region CNR of the electrode structure ST. The recess holes H1 may be formed in the electrode structure ST to have the same depth d1 as measured from the top surfaces of the pad regions P1 (also referred to herein as stepping surfaces) of the top electrode structure 20 and may have bottom surfaces which expose the bottom electrode structure 10. The depth d1 may be the same or substantially the same as the height of the top electrode structure 20. Hence, each pad region P1 may have a recess hole H1 penetrating the pad region to a depth of d1 with a bottom surface exposing the bottom electrode structure 10 or penetrating within the bottom electrode structure without exposing the substrate 1. More specifically, as shown in FIG. 6 a first recess hole H1 may be formed in the highest top pad region P1 and penetrate the top electrode structure 20 to expose the top surface of the bottom electrode structure 10. A second recess hole H1 may be formed in the next top pad region (second top pad region arranged in the first direction) P1 adjacent to the first top pad region P1 and penetrate the top electrode structure 20. The second recess hole H1 may also penetrate the bottom electrode structure 10 to a depth equal to the height of the step of the corresponding second top pad region P1. Likewise, third to sixth recess holes H1 may be formed in the corresponding third to sixth top pad regions with the bottom surface of each recess hole H1 penetrating deeper inside the bottom electrode structure 10 as the distance from the cell array region CAR increases. FIG. 4 illustrates an example having six recess holes H1 formed in the connection region one for each top pad region P1, however, the invention may not be limited in this way. For example, the number of top pad regions P1 may be changed by design. Also, the number of recess holes H1 formed in each top pad region P1 may be changed by design.

The recess holes H1 may be formed all at once by a single etching process using a single mask. Since the recess holes H1 are formed to the same depth d1 from the stepping surfaces of the top electrode structure 20 which are disposed at vertically different positions, the distances of the bottom surfaces of the recess holes H1 from the substrate 1 may be different from one another. In the present embodiment, the bottom surfaces of the recess holes H1 may be disposed closer to the substrate 1 as the distances thereof from the cell array region CAR increase.

At the bottoms of the recess holes H1, each of the bottom electrodes 10a to 10f may have bottom pad region exposed by the top electrodes 20a to 20f and other bottom electrode on it.

In the stepping surfaces of the top electrode structure 20, there may be formed a plurality of first key grooves KH1 which penetrate the top electrode structure 20 by a predetermined depth in the third direction TD. Each of the first key grooves KH1 may vertically pass through an interlayer dielectric layer 30 and an electrode lying immediately thereunder which form a corresponding step or stepping surface. That is, the depth of each first key groove KH1 may correspond to the vertical pitch of the top electrodes 20a to 20f. When viewed from the top, the diameter of each first key groove KH1 may be smaller than the diameter of each recess hole H1.

When viewed from the top, at least one recess hole H1 and at least one first key groove KH1 may be disposed in each top pad region P1. It is illustrated in the embodiment shown in the drawing that one recess hole H1 and one first key groove KH1 are disposed in each top pad region P1.

The recess holes H1 which are defined in the different top pad regions P1 may configure a first row by being disposed in a line in the first direction FD, and the first key grooves KH1 which are defined in the different top pad regions P1 may configure a second row by being disposed in a line in the first direction FD. Each first key groove KH1 and each recess hole H1 which are disposed in the same top pad region P1 may be disposed in a line in the second direction SD.

A plurality of second key grooves KH2 may be defined at the bottoms of the recess holes H1, respectively. Each second key groove KH2 may penetrate the bottom electrode structure 10 by a predetermined depth in the third direction TD at the bottom of each recess hole H1. Each of the second key grooves KH2 may vertically pass through one corresponding interlayer dielectric layer 30 exposed by each recess hole H1 and one bottom electrode 10g to 10b lying immediately thereunder. The depth of each second key groove KH2 may correspond to the vertical pitch of the bottom electrodes 10a to 10g. The vertical pitch of the bottom electrodes 10a to 10g and the vertical pitch of the top electrodes 20a to 20f may be the same or substantially the same with each other. In this case, the first key grooves KH1 and the second key grooves KH2 may have the same or substantially the same depth. When viewed from the top, the diameter of each second key groove KH2 may be smaller than the diameter of each recess hole H1, and may be the same or substantially the same as the diameter of each first key groove KH1.

Figure 8:
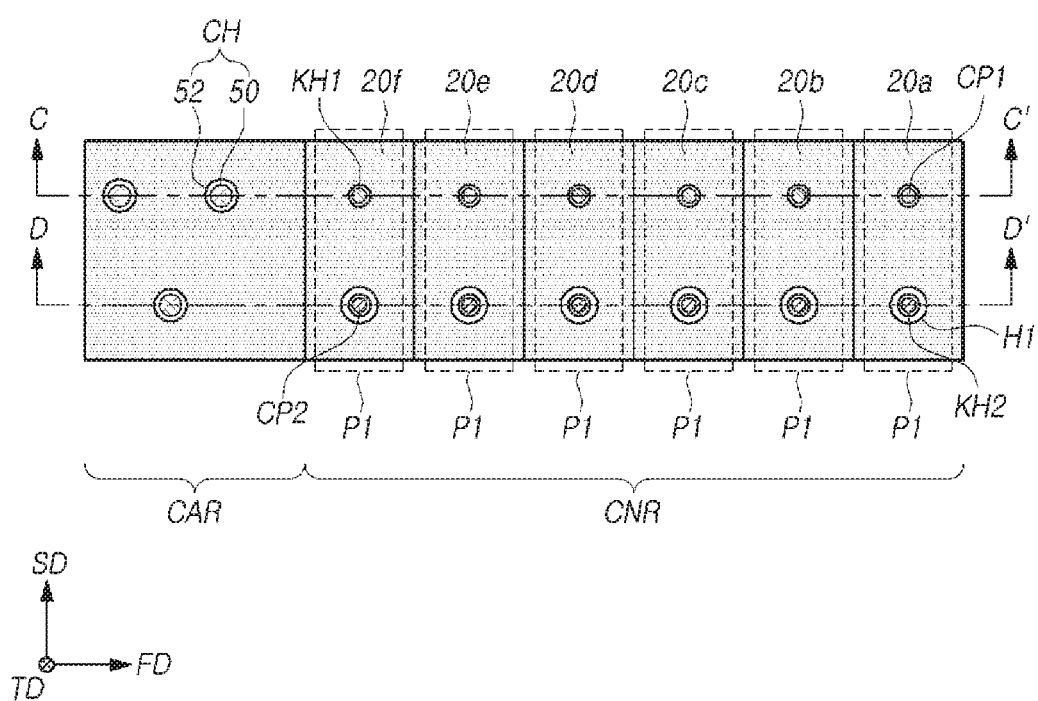
FIG. 8 is a top view illustrating a representation of an example of a semiconductor memory device in accordance with an embodiment of the disclosure.
Figure 9:
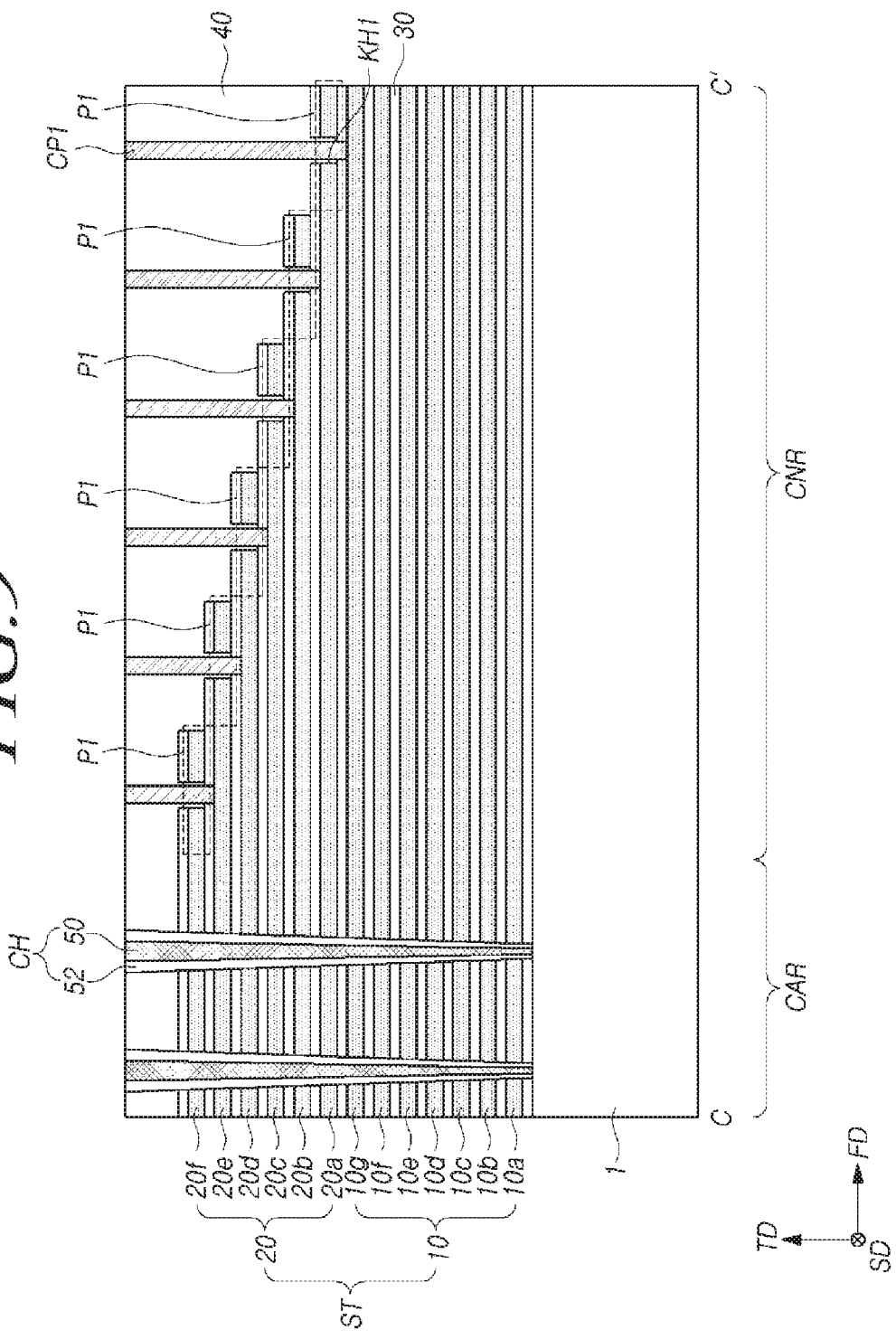
FIG. 9 is a cross-sectional view taken along the line C-C' of FIG. 8.
Figure 10:
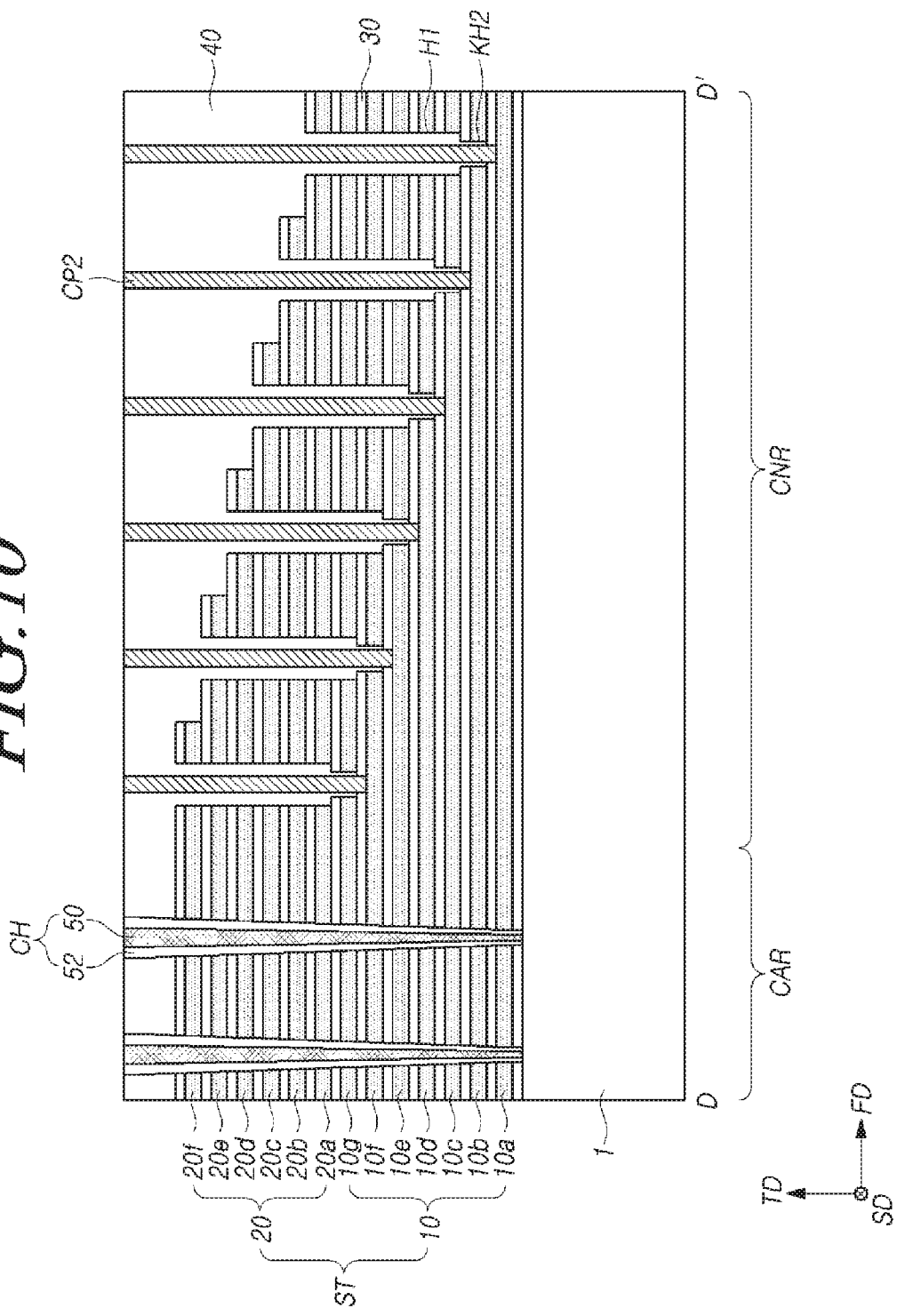
FIG. 10 is a cross-sectional view taken along the line D-D' of FIG. 8.

FIGS. 8 to 10 are views illustrating a representation of an example of a semiconductor memory device in accordance with an embodiment of the disclosure. In detail, FIG. 8 is a top view illustrating a representation of an example of the semiconductor memory device in accordance with an embodiment of the disclosure, FIG. 9 is a cross-sectional view taken along the line C-C' of FIG. 8, and FIG. 10 is a cross-sectional view taken along the line D-D' of FIG. 8. For the sake of simplification in illustration, illustration of a dielectric layer 40 is omitted in FIG. 8.

Referring to FIGS. 8 to 10, a dielectric layer 40 may be formed on substrate 1 and electrode structure ST to cover the substrate 1 and the electrode structure ST and fill recess holes H1 and first and second key grooves KH1 and KH2. The dielectric layer 40 may include a silicon oxide. For example, the dielectric layer 40 may include an HDP (high density plasma) oxide layer or a TEOS (tetra-ethyl-Orthosilicate) oxide layer.

A plurality of channel structures CH which pass through the dielectric layer 40 and the electrode structure ST in the third direction TD may be formed in the cell array region CAR. The channel structures CH may be surrounded by bottom electrodes 10a to 10g and top electrodes 20a to 20f which are stacked in the third direction TD.

Each of the channel structures CH may include a channel layer 50 and a gate dielectric layer 52. The channel layer 50 may extend in the third direction TD from the top surface of the substrate 1, and may be electrically connected between the substrate 1 and a bit line (not shown). The channel layer 50 may be electrically connected to a source region (not shown) which is defined in the substrate 1. The gate dielectric layer 52 may have a straw or cylinder shell structure which surrounds the outer wall of the channel layer 50. The gate dielectric layer 52 may include a tunnel dielectric layer, a data storage layer and a blocking dielectric layer which are sequentially disposed from the outer wall of the channel layer 50.

While it is illustrated in the embodiment of FIGS. 8 to 10 that the channel layer 50 has a straight shape, it is to be noted that the disclosure is not limited thereto. Although not shown, for example, the channel layer 50 may have a U-like shape. Also, as illustrated in FIG. 9, the channel structures CH may have a tapered shape with a cross-section thereof decreasing gradually in size as the distance from the top surface of each channel increases.

First contact plugs CP1 may be connected to the top electrodes 20$a$ to 20$f$ and the uppermost bottom electrode 10$g$, respectively, by vertically passing through the dielectric layer 40 and interlayer dielectric layers 30. The first contact plugs CP1 may pass through the first key grooves KH1. When viewed from the top, each of the first contact plugs CP1 may overlap with each of the first key grooves KH1, and the diameter of each first contact plug CP1 may be smaller than the diameter of each first key groove KH1.

Second contact plugs CP2 may be connected to the bottom electrodes 10$a$ to 10$f$, respectively, by vertically passing through the dielectric layer 40 and the interlayer dielectric layers 30. Each of the second contact plugs CP2 may pass through each recess hole H1 and each second key groove KH2 which vertically overlap. Each of the second contact plugs CP2 may be connected to each of the bottom electrodes 10$a$ to 10$f$ at the bottom of each second key groove KH2. When viewed from the top, each of the second contact plugs CP2 may overlap with each of the recess holes H1 and each of the second key grooves KH2. The diameter of each second contact plug CP2 may be smaller than the diameter of each second key groove KH2.

If the lengths of the top pad regions P1 in the first direction FD are not properly limited and the positions of the recess holes H1 are not properly limited, an open failure in which the first and second contact plugs CP1 and CP2 are not connected with their respective electrodes or a short failure in which the first and second contact plugs CP1 and CP2 are connected with two or more electrodes may occur.

In the present embodiment, the lengths of the top pad regions P1 in the first direction FD and the positions of the recess holes H1 may be determined based on the first and second key grooves KH1 and KH2. In other words, the first and second key grooves KH1 and KH2 may serve as alignment keys in the process for forming the top pad regions P1 and the process for forming the recess holes H1.

Since the lengths of the top pad regions P1 in the first direction FD may be properly adjusted by using the first and second key grooves KH1 and KH2 in the process for forming the top pad regions P1 and the positions of the recess holes H1 may be properly adjusted by using the first and second key grooves KH1 and KH2 in the process for forming the recess holes H1, it is possible to prevent the occurrence of the above-described open failure or short failure.

Figure 11:
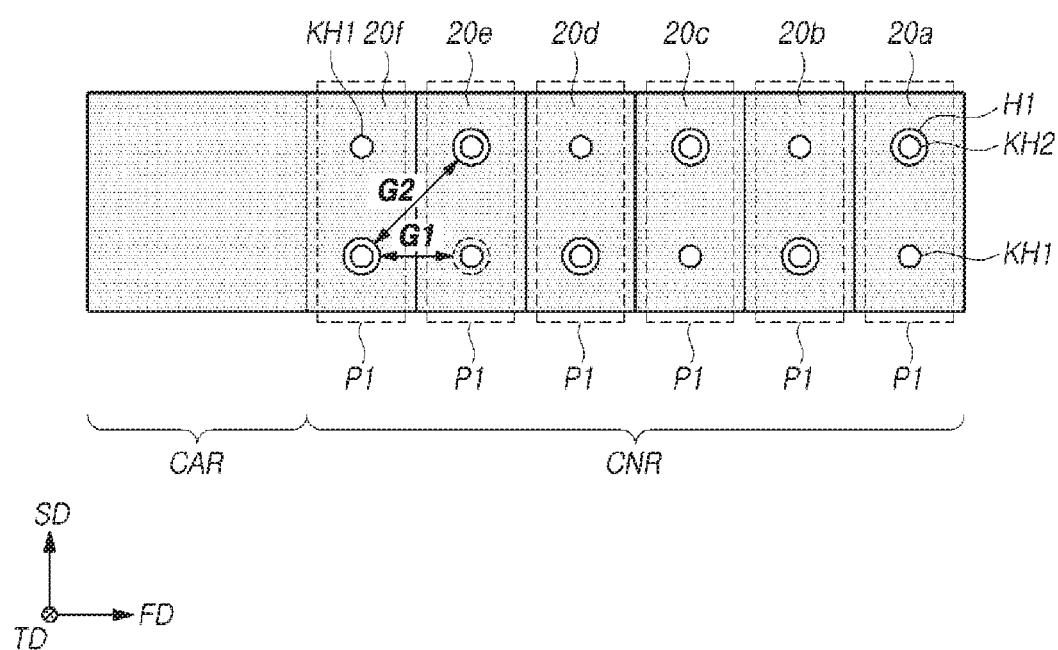
FIG. 11 is a top view illustrating a representation of an example of a semiconductor memory device in accordance with an embodiment of the disclosure.

FIG. 11 is a top view illustrating a representation of an example of a semiconductor memory device in accordance with an embodiment of the disclosure.

Referring to FIG. 11, first and second rows of alternating first key grooves KH1 and recess holes H1 may be formed, when viewed from the top. The first and second rows of alternating first key grooves KH1 and recess holes H1 may extend in the first direction FD. The first row may include first key grooves KH1 defined in the top pad regions P1 of odd-numbered positions from a cell array region CAR and recess holes H1 defined in top pad regions P1 of even-numbered positions from the cell array region CAR. The second row may include recess holes H1 defined in the top pad regions P1 of the odd-numbered positions from the cell array region CAR and first key grooves KH1 which are defined in the top pad regions P1 of the even-numbered positions from the cell array region CAR. In each top pad region P1 a recess hole H1 and a first key groove KH1 formed therein may be aligned in the second direction SD. At least one recess hole H1 and at least one first key groove KH1 may be formed in each top pad region P1.

In each row, the recess holes H1 and the first key grooves KH1 may be alternately disposed. The disposition sequence of the recess holes H1 and the first key grooves KH1 in the first row and the disposition sequence of the recess holes H1 and the first key grooves KH1 in the second row may be different from each other. Due to this fact, when viewed from the top, the recess holes H1 may be disposed in a zigzag pattern in the first direction FD. Also, the first key grooves KH1 may be disposed in a zigzag pattern in the first direction FD.

The diameter of each recess hole H1 may be larger than the diameter of each first key groove KH1. Accordingly, if the recess hole H1 are disposed in a line in the first direction FD, as the gap between the recess holes H1 becomes narrow, it may be difficult to secure a process margin when forming the recess holes H1. If the recess holes H1 are disposed in a zigzag pattern, the gap between the recess holes H1 may increase when compared to the case of disposing the recess holes H1 in a line. As illustrated in FIG. 11, in the case where the recess holes H1 are disposed in a line, a gap G1 between adjacent recess holes H1 may be narrower than a gap G2 between adjacent recess holes H1 disposed in a zigzag pattern. Thus, arranging the recess holes H1 in a zig-zag pattern allows for an increased gap G2 when compared to the gap G1.

According to the present embodiment, since the gap between the recess holes H1 may be increased by disposing the recess holes H1 in a zigzag pattern in the first direction FD, it is possible to improve the margin of a process for forming the recess holes H1, and it is possible to suppress the occurrence of a processing failure in the process for forming the recess holes H1. Also, as illustrated in FIG. 11, a plurality of second key grooves KH2 may be defined at the bottoms of the recess holes H1, respectively. Since, the second key grooves have been described earlier in detail with reference to the embodiment of FIG. 2, detailed description thereof will now be omitted.

It is noted, that while it is illustrated in the embodiments described above with reference to FIGS. 4 to 11 that first and second key grooves KH1 and KH2 are included, it is to be noted that either the first or the second key grooves KH1 and KH2 may be omitted or in some embodiments both the first and second key grooves KH1 and KH2 may be omitted.

Hereinbelow, a method for forming a semiconductor memory device in accordance with an embodiment of the disclosure will be described with reference to the FIGS. 12A to 18C.

FIGS. 12A to 18C are representations of examples of views to assist in the explanation of a method for forming a semiconductor memory device in accordance with an embodiment of the disclosure. In detail, FIGS. 12A to 18A are top views illustrating the semiconductor memory device in accordance with the embodiment of the disclosure according to a manufacturing sequence, FIGS. 12B to 18B are cross-sectional views taken along the line E-E' of FIGS. 12A to 18A, and FIG. 18C is a cross-sectional view taken along the line F-F' of FIG. 18A.

Figure 12A:
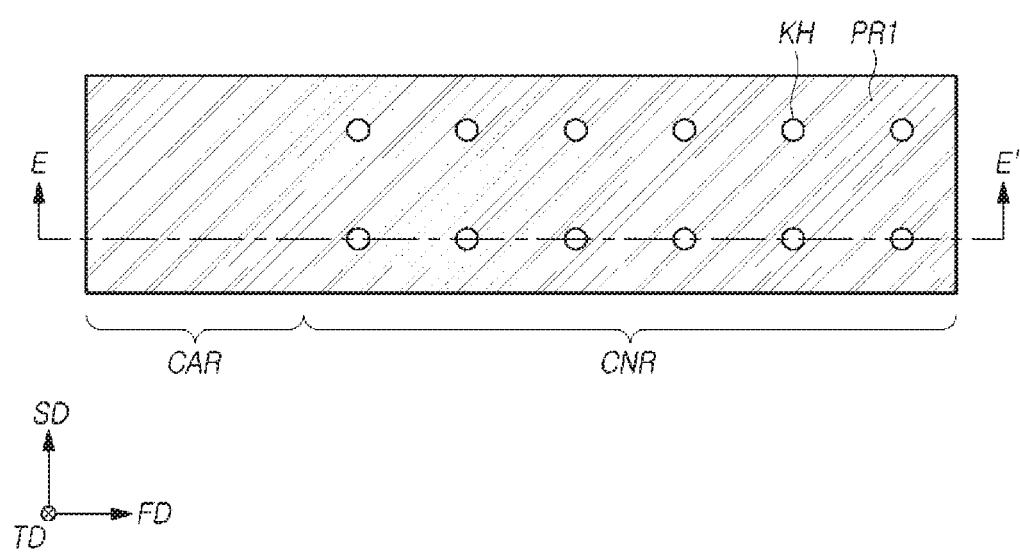
Figure 12B:
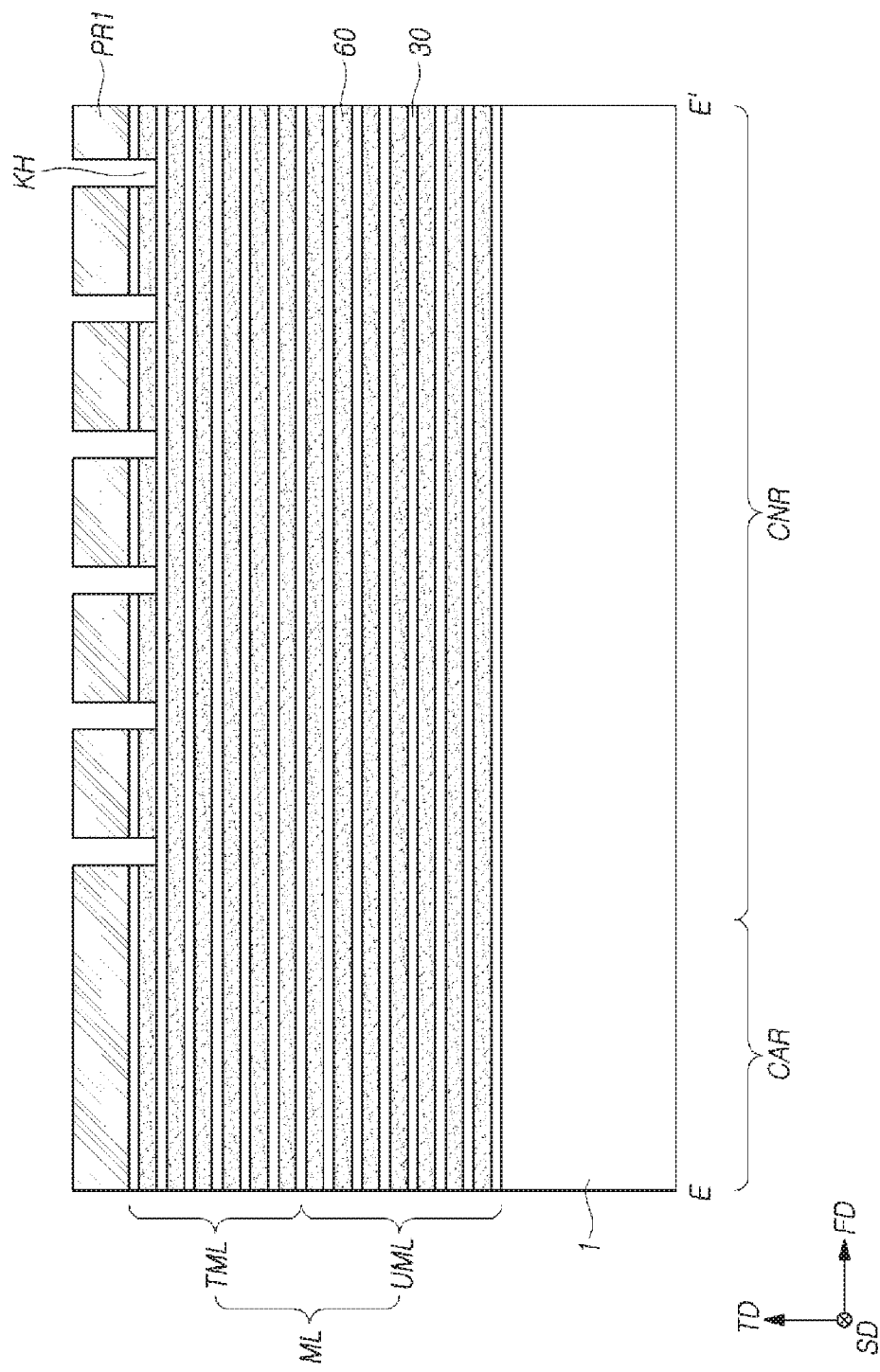

Referring to FIGS. 12A and 12B, a pre-stack ML may be formed on the substrate 1. The pre-stack ML may include a bottom stack UML which is stacked on the substrate 1 and a top stack TML which is stacked on the bottom stack UML. Each of the bottom stack UML and the top stack TML may include first material layers 60 and second material layers 30 which are alternately stacked.

The first material layers 60 and the second material layers 30 may be formed of different materials. For example, the second material layers 30 may be formed of a dielectric material for interlayer dielectric layers. The first material layers 60 may be used as sacrificial layers and be formed of a dielectric material which has an etching selectivity with respect to the second material layers 30. For example, the second material layers 30 may be formed as silicon oxide layers, and the first material layers 60 may be formed as silicon nitride layers.

Then, a plurality of key grooves KH are formed in the top stack TML of a connection region CNR. The key grooves KH may be disposed in the first direction FD and the second direction SD. The number of the key groves KH which are disposed in the first direction FD may be the same or substantially the same as the number of the first material layers 60 which are included in the top stack TML. In the present embodiment, it is illustrated that the number of the first material layers 60 included in the top stack TML is 6 and, therefore, six key grooves KH are disposed in the first direction FD.

While it is illustrated in the embodiment shown in the drawing that the number of key grooves KH disposed in the second direction SD is 2, it is to be noted that the disclosure is not limited thereto. In some embodiments the number of key grooves KH disposed in the second direction SD may be 1 or may be 3 or more.

The key grooves KH may serve as alignment keys in a process for forming a stepped structure to be described below with reference to FIGS. 13A to 17B and a process for forming recess holes H1 to be described later with reference to FIGS. 20A to 20C.

The key grooves KH may be formed through the following processes.

First, a first mask pattern PR1 which has a plurality of openings is formed on the top stack TML. Then, through etching the uppermost second material layer 30 and the uppermost first material layer 60 of the top stack TML by using the first mask pattern PR1 as an etch mask, the key grooves KH are formed. The depth of the key grooves KH may correspond to the vertical pitch of the first material layers 60.

The first mask pattern PR1 may be formed using a photolithography process, and may be removed after the key grooves KH are formed.

Figure 13A:
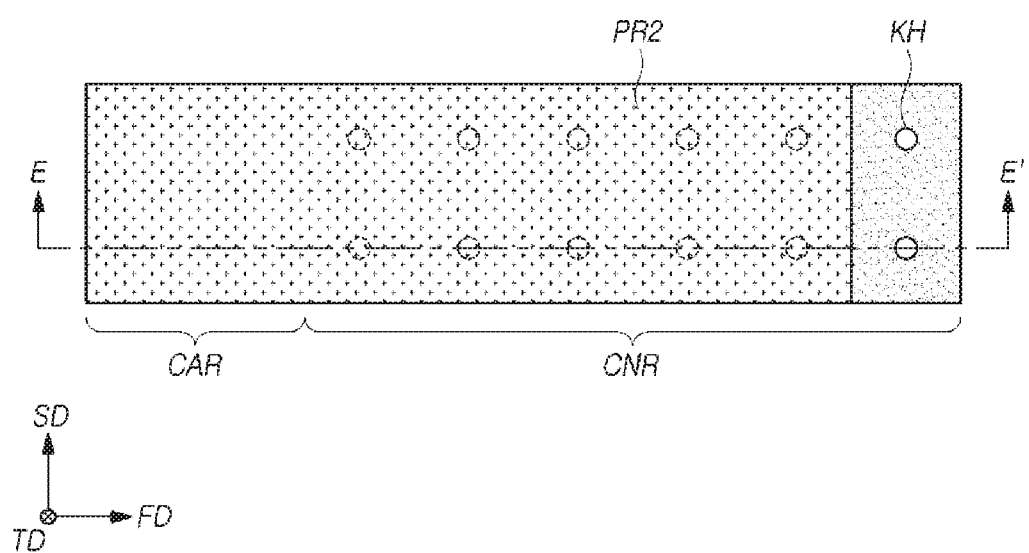

Referring to FIGS. 13A and 13B, a second mask pattern PR2 may be formed on the top stack TML. The second mask pattern PR2 may cover a cell array region CAR and the connection region CNR which is adjacent to the cell array region CAR, and may expose the end portion of the connection region CNR which is separated from the cell array region CAR. The second mask pattern PR2 may expose the outermost key grooves KH which are formed in the end portion of the connection region CNR. The second mask pattern PR2 may be formed by a method of forming a photoresist on the top stack TML and patterning the photoresist through an exposure and development process to expose the end portion of the connection region CNR.

Then, the top stack TML of the connection region CNR may be etched by a pad etching process using the second mask pattern PR2 as an etch mask. The etching thickness of the pad etching process may correspond to the vertical pitch of the first material layers 60.

In the pad etching process, the uppermost second material layer 30 may be etched by using the second mask pattern PR2 as an etch mask. At the same time with this, the second material layer 30 at the bottoms of the outermost key grooves KH may be etched together. Then, the uppermost first material layer 60 may be etched by using the second mask pattern PR2 as an etch mask. At the same time with this, the first material layer 60 at the bottoms of the outermost key grooves KH may be etched together. The uppermost second material layer 30 and the uppermost first material layer 60 which are etched may expose another second material layer 30 lying thereunder. The outermost key grooves KH may then be transferred to the newly exposed second material layer 30 and the first material layer 60 lying immediately thereunder.

Figure 14A:
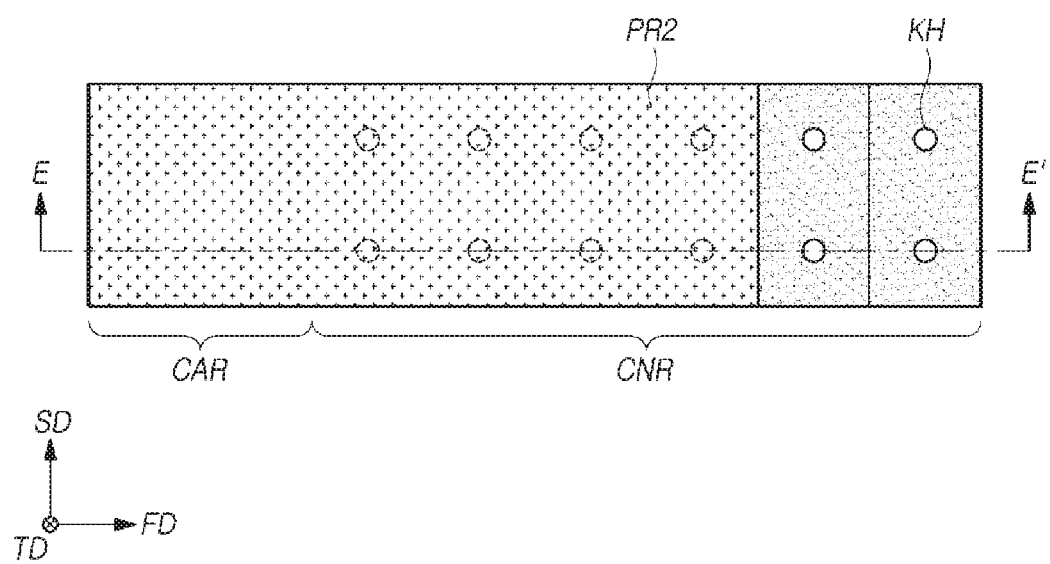
Figure 14B:
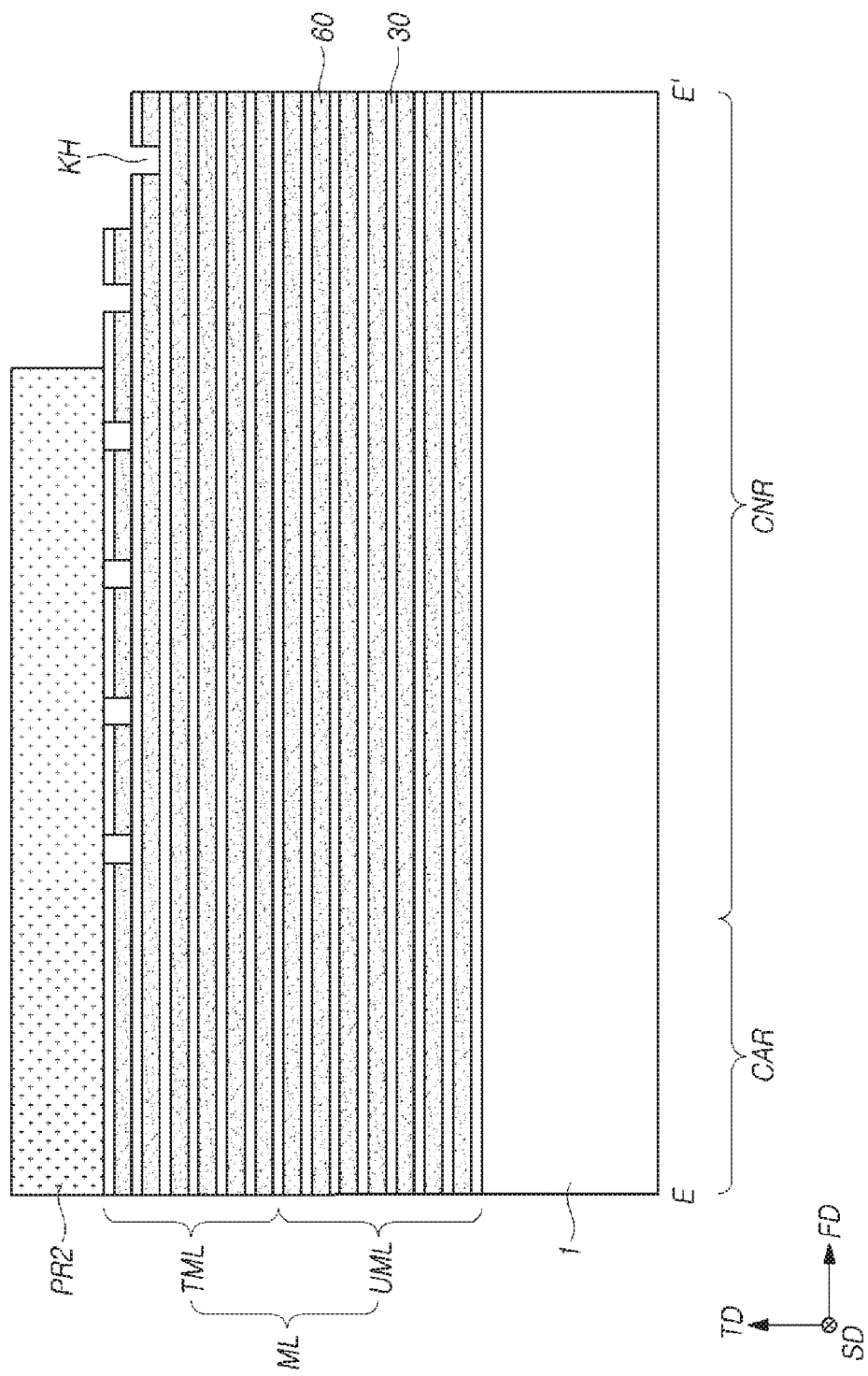

Referring to FIGS. 14A and 14B, a trimming process may be performed for the second mask pattern PR2. Namely, an isotropic etching process may be performed for the second mask pattern PR2. The trimming process may be performed by using an etchant capable of removing the second mask pattern PR2. Due to this fact, the height and width of the second mask pattern PR2 may be reduced. As the width of the second mask pattern PR2 is reduced, other key grooves KH adjacent to the outermost key grooves KH may be additionally exposed. In the trimming process, the length of the second mask pattern PR2 to be trimmed, in the first direction FD, may be adjusted by using the key grooves KH as reference positions.

The steps described above with reference to FIGS. 13A to 14B may be one cycle for forming a stepped structure in the connection region CNR. That is to say, the cycle may include the pad etching process of etching the top stack TML of the connection region CNR which is exposed by the second mask pattern PR2, by a thickness corresponding to the vertical pitch of the first material layers 60, through using the second mask pattern PR2 as an etch mask, and the trimming process of reducing the width of the second mask pattern PR2. The repetition of the cycle will be described below.

Figure 15A:
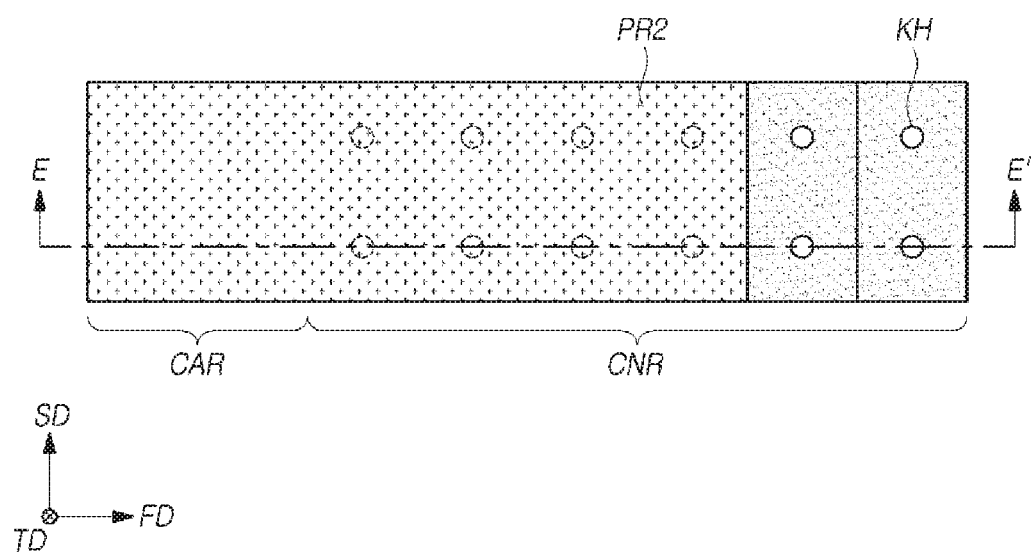
Figure 15B:
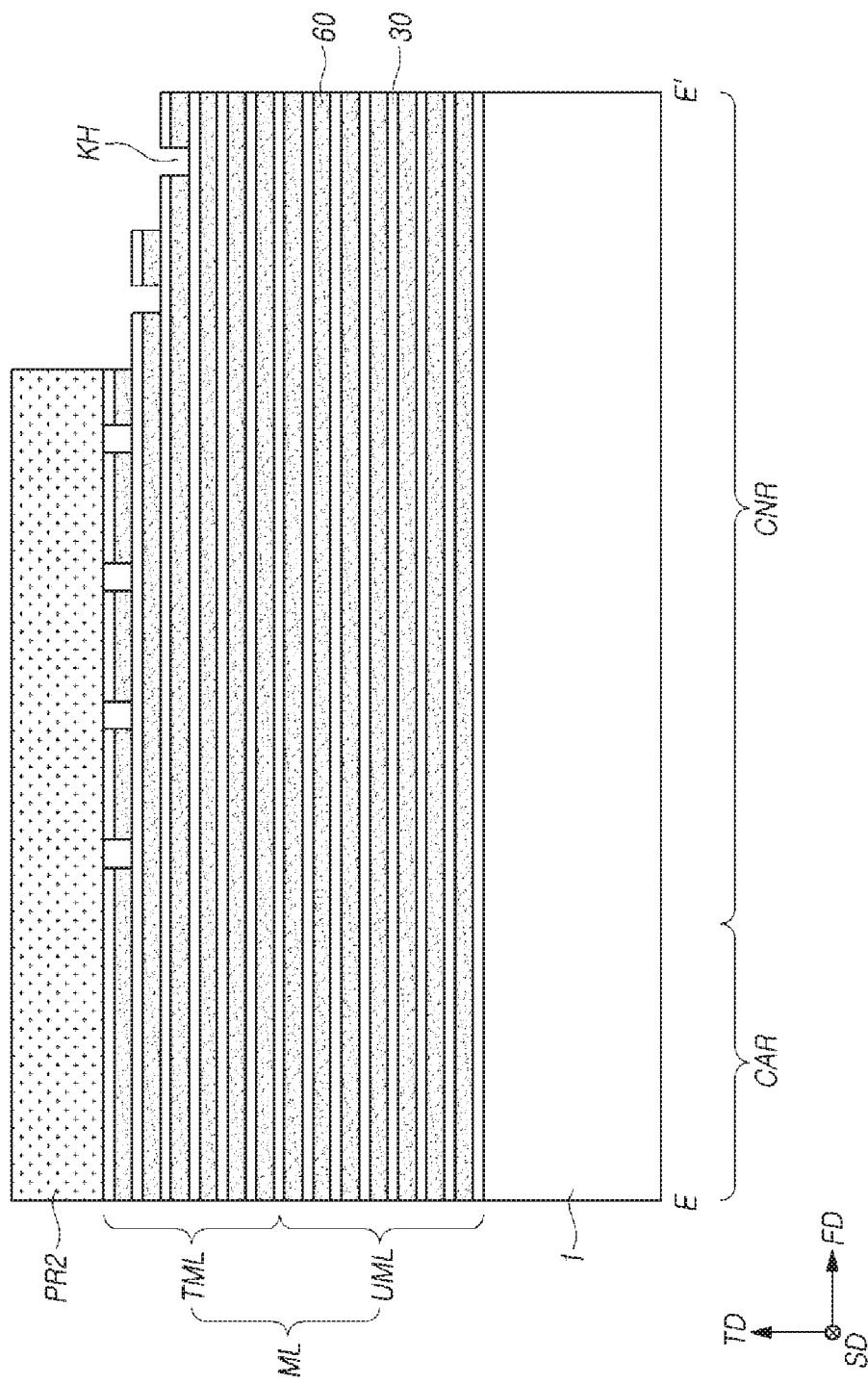

Referring to FIGS. 15A and 15B, the pad etching process of etching the top stack TML of the connection region CNR may be performed by using the second mask pattern PR2 of which the size is reduced once, as an etch mask. The etching thickness of the pad etching process may correspond to the vertical pitch of the first material layers 60.

Figure 16A:
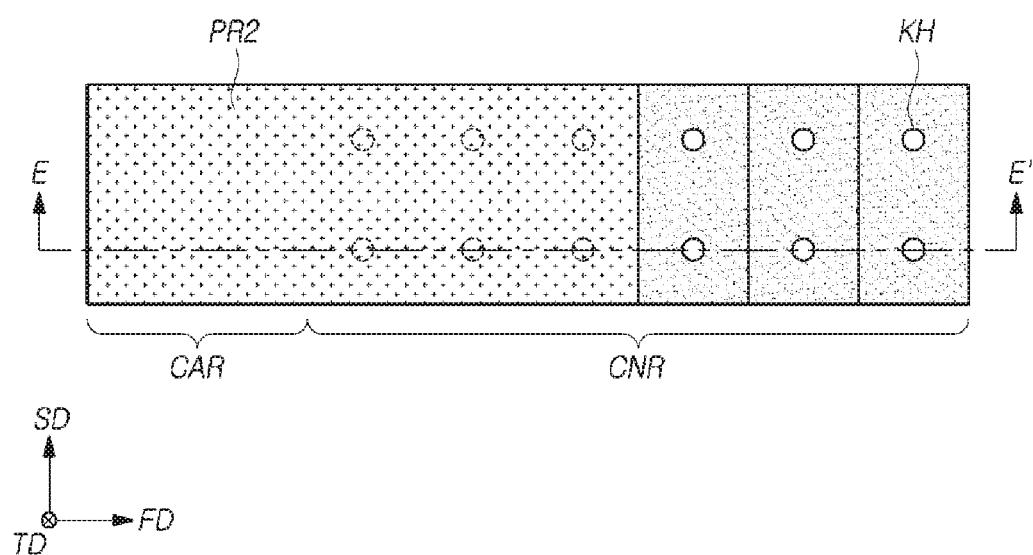
Figure 16B:
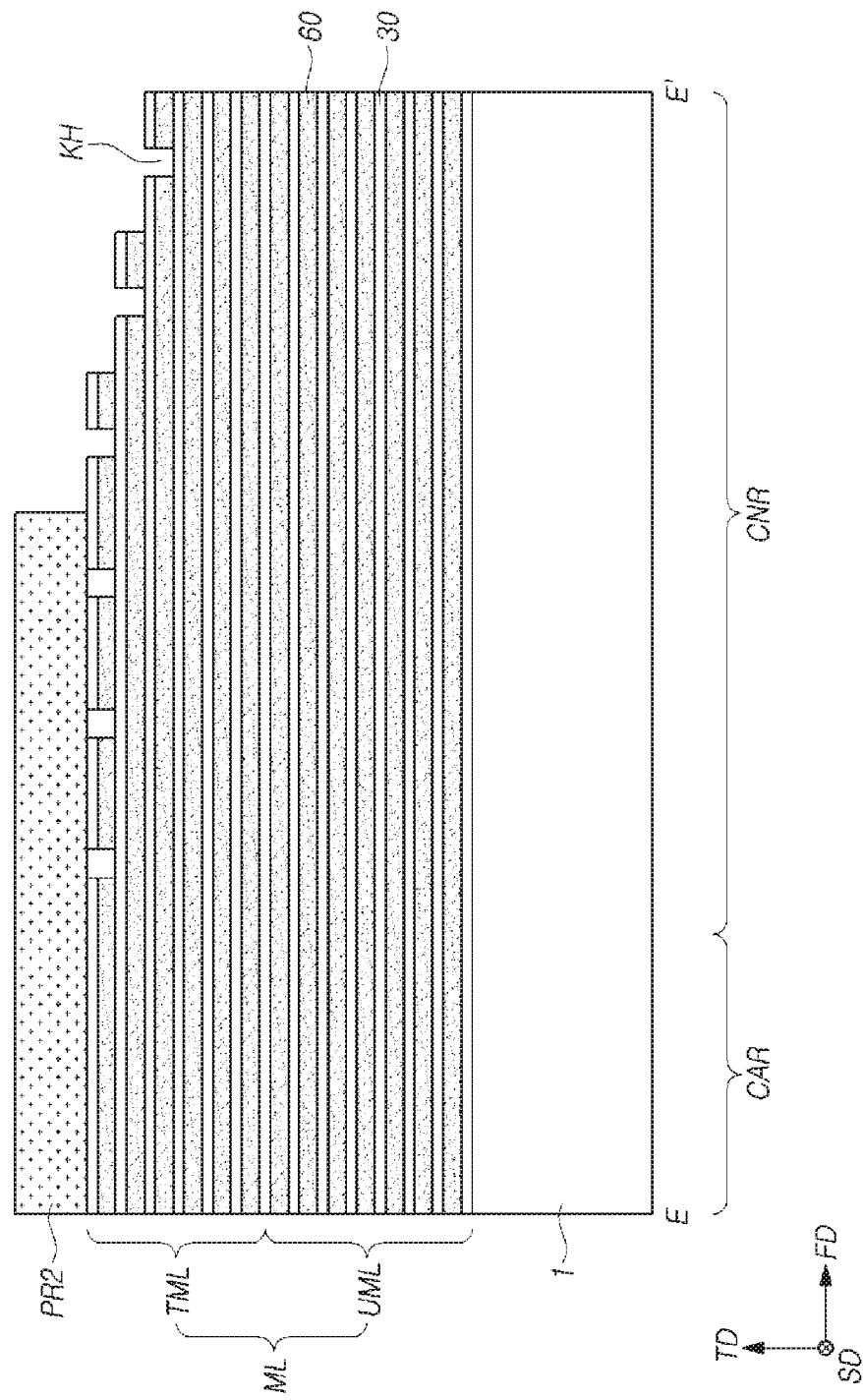

Referring to FIGS. 16A and 16B, the trimming process may be performed again for the second mask pattern PR2. During the trimming process, the width and height of the second mask pattern PR2 may be reduced. As the width of the second mask pattern PR2 is reduced, another pair of key grooves KH may be additionally exposed. By this fact, it may be confirmed that the cycle is repeated once more.

Figure 17A:
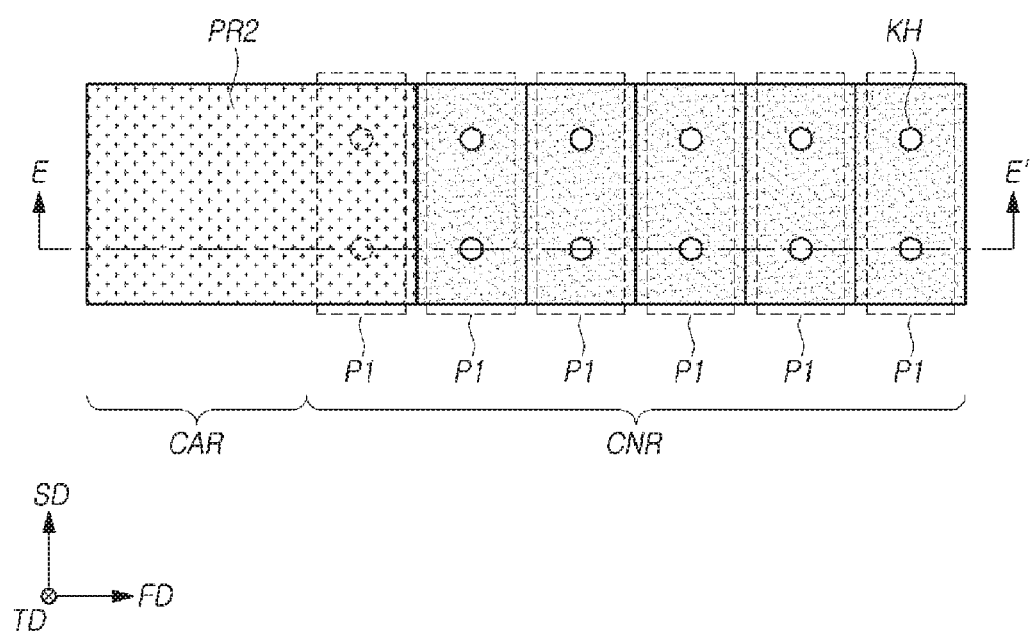
Figure 17B:
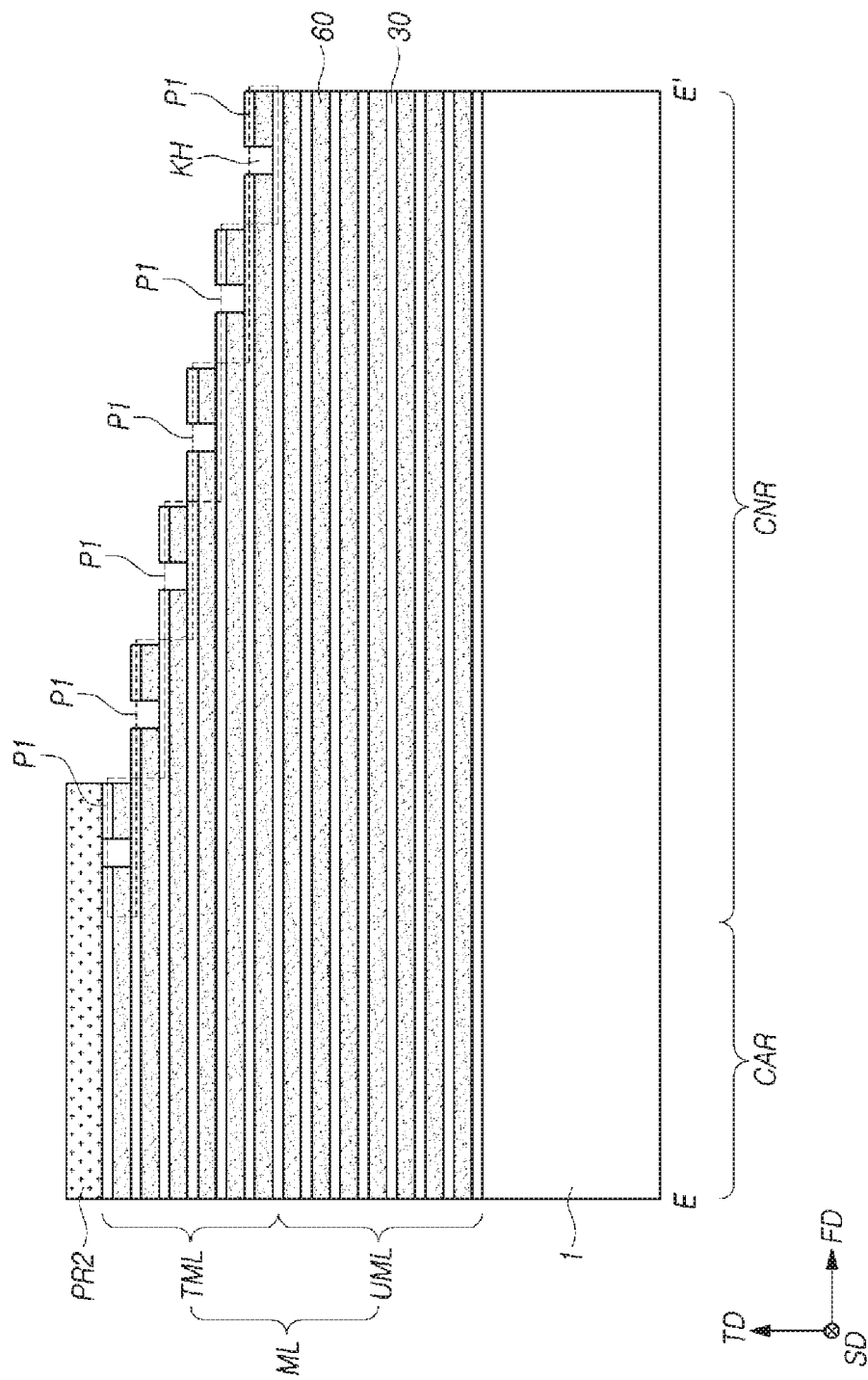

Referring to FIGS. 17A and 17B, the cycle may be repeated until the lowermost second material layer 30 and the lowermost first material layer 60 of the top stack TML are etched. Due to this fact, the uppermost second material layer 30 of the bottom stack UML may be exposed.

Through the repetition of the cycle by using the second mask pattern PR2, a stepped structure may be formed in the top stack TML of the connection region CNR. Each of the first material layers 60 which are included in the top stack TML may have a top pad region P1 which is exposed by another first material layer 60 positioned thereon. The key grooves KH may be respectively transferred to top pad regions P1 of the first material layers 60. The second mask pattern PR2 may be removed after the stepped structure is formed.

Figure 18A:
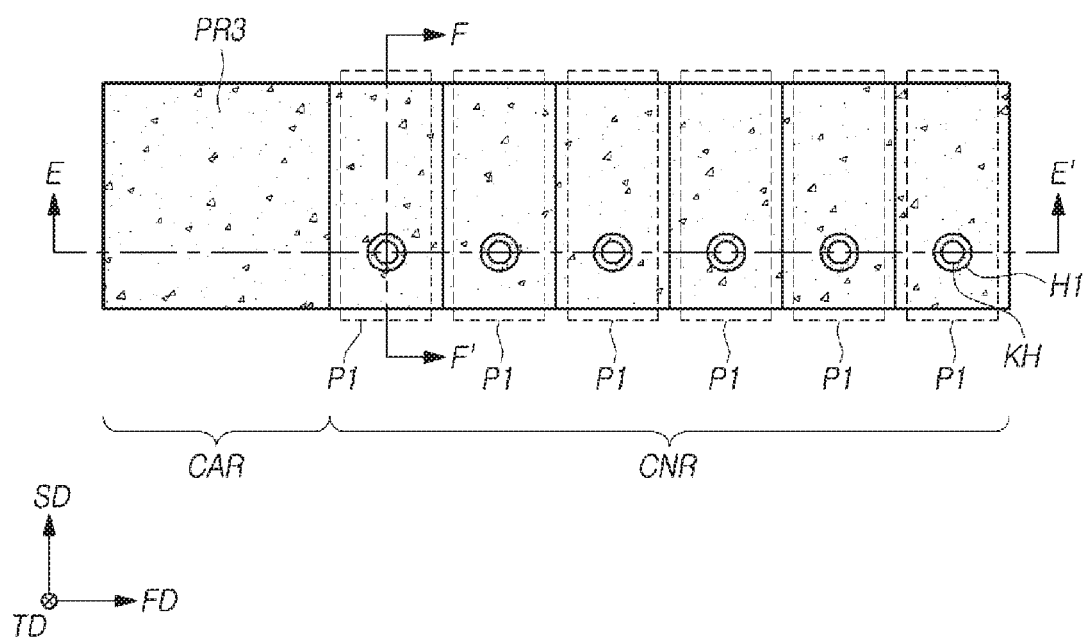
Figure 18C:
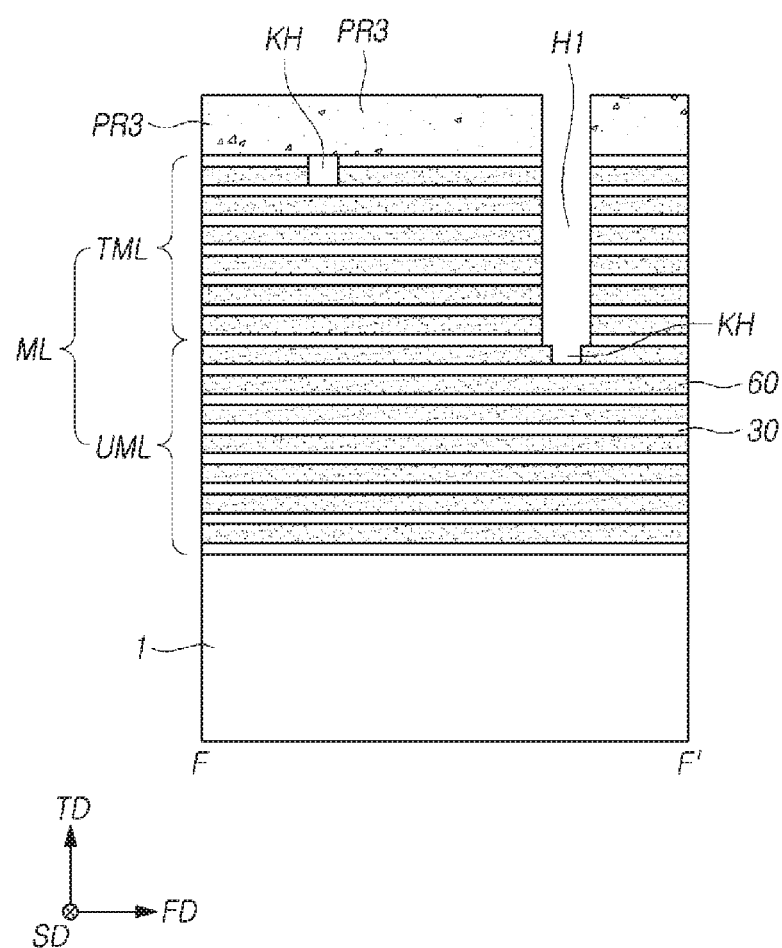
FIG. 18C is a cross-sectional view taken along the line F-F' of FIG. 18A.

Referring to FIGS. 18A to 18C, by applying a photoresist on the top stack TML formed with the stepped structure and patterning the photoresist through an exposure and development process, a third mask pattern PR3 having hole type openings which expose portions of the top pad regions P1, respectively, may be formed. The key grooves KH may be used as alignment keys in the process of forming the openings. The opening positions of the third mask pattern PR3 may be adjusted by using the key grooves KH as reference positions.

The openings of the third mask pattern PR3 may expose the key grooves KH, respectively, and the area of each opening of the third mask pattern PR3 may be larger than the area of each key groove KH.

Then, by etching the top stack TML and the bottom stack UML through using the third mask pattern PR3 as an etch mask, a plurality of recess holes H1 having bottom surfaces which expose the bottom stack UML may be formed. The recess holes H1 may have the same depth d1. The depth d1 may be the same or substantially the same as the height of the top stack TML.

Due to the differences in the positions of the stepping surfaces of the stepped structure of the top stack TML, the bottom surfaces of the recess holes H1 may be disposed at vertically different positions. Since the recess holes H1 are formed to the same depth d1 from the stepping surfaces of the top stack TML which are disposed at vertically different positions, the distances of the bottom surfaces of the recess holes H1 from the substrate 1 may be different from one another.

At the bottom of each of the recess holes H1, each of the first material layers 60 of the bottom stack UML may be exposed by the first material layers 60 positioned thereon. At the bottom of each of the recess holes H1, each of the first material layers 60 of the bottom stack UML may be covered by the second material layer 30 positioned thereon.

Thereafter, while not shown, by forming channel structures (see the reference symbol CH of FIG. 10) which vertically pass through the top stack TML and the bottom stack UML, in the cell array region CAR, removing the first material layers 60 which are used as sacrificial layers and filling a conductive material in spaces which are formed by the removal of the first material layers 60, top electrodes (see the reference symbols 20a to 20f of FIG. 9) and bottom electrodes (see the reference symbols 10a to 10g of FIG. 9) may be formed.

While it is illustrated in the embodiment described above with reference to FIGS. 12A to 18C that the recess hole forming process is performed after performing the stepped structure forming process, it is to be noted that the stepped structure forming process and the recess hole forming process may be performed in a reverse order.

Further, while it is illustrated in the embodiment described above with reference to FIGS. 12A to 18C that the key holes KH are formed before the stepped structure is formed, it is to be noted that the process of forming the key holes KH may be omitted in some embodiments.

Figure 19:
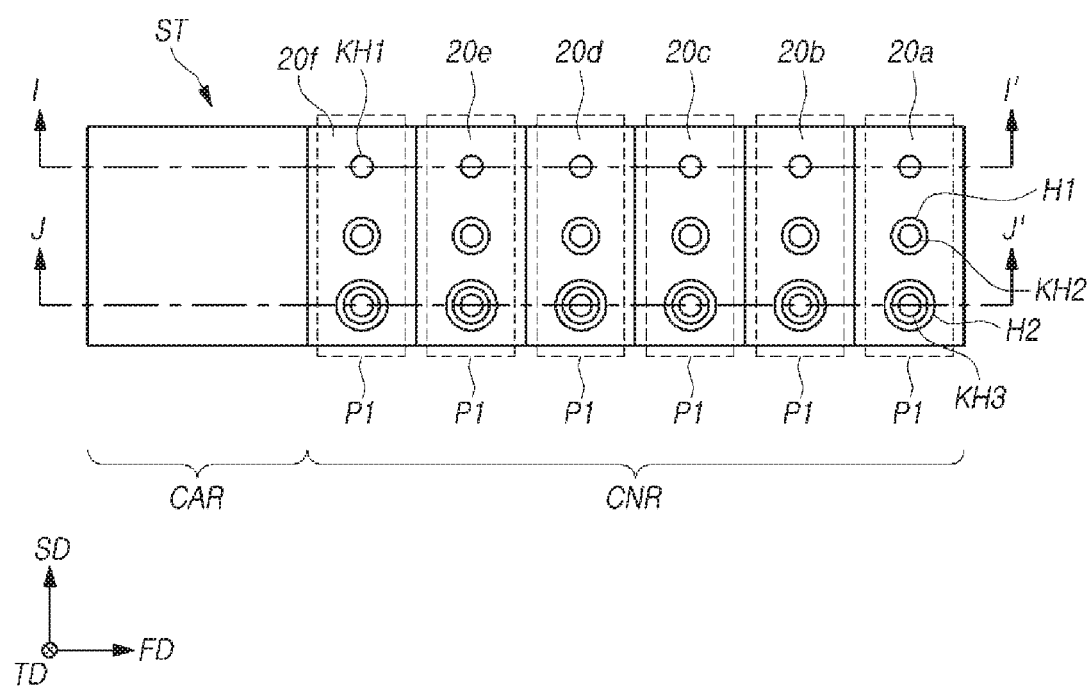
FIG. 19 is a top view illustrating a representation of an example of a semiconductor memory device in accordance with an embodiment of the disclosure.
Figure 20:
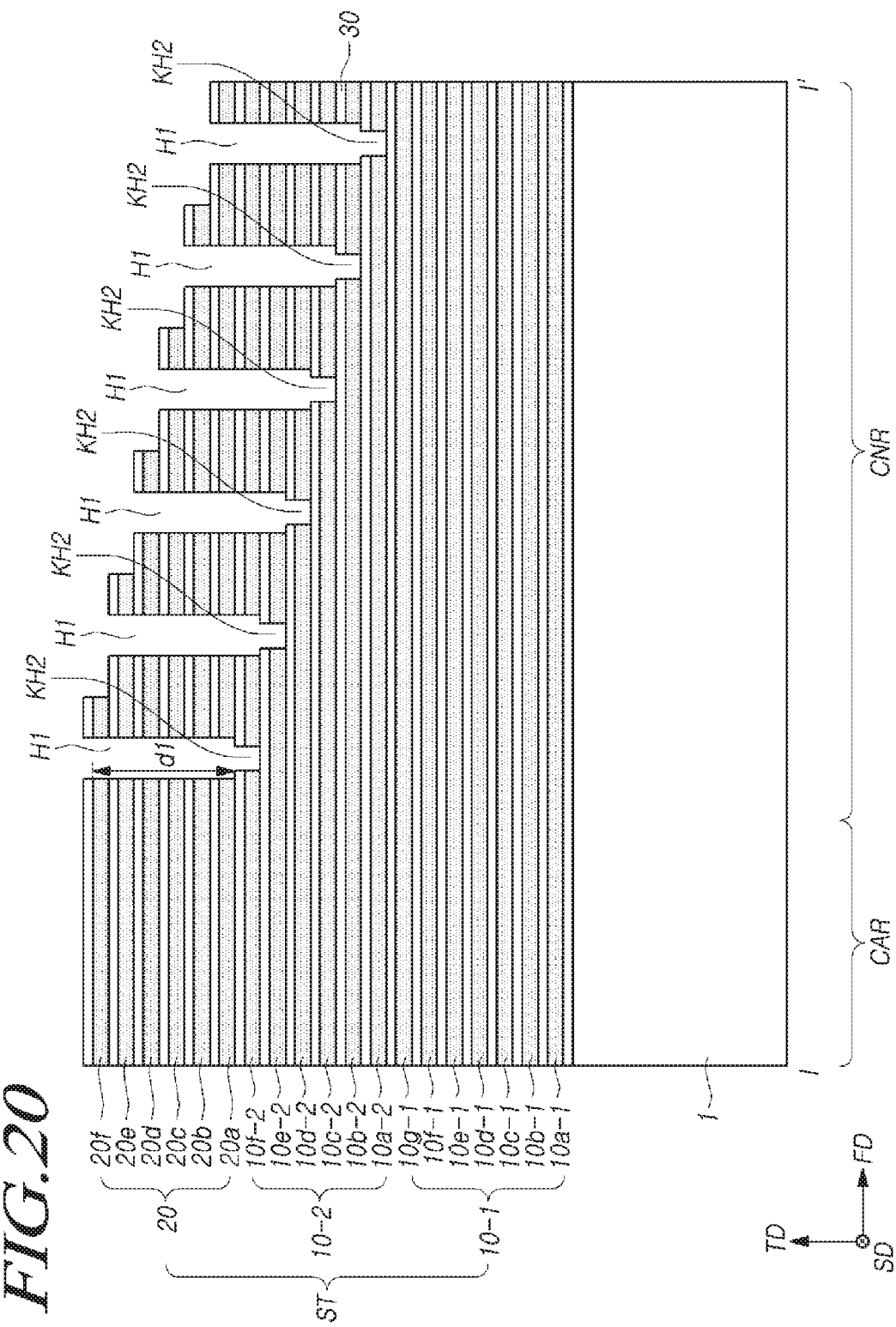
FIG. 20 is a cross-sectional view taken along the line I-I' of FIG. 19.
Figure 21:
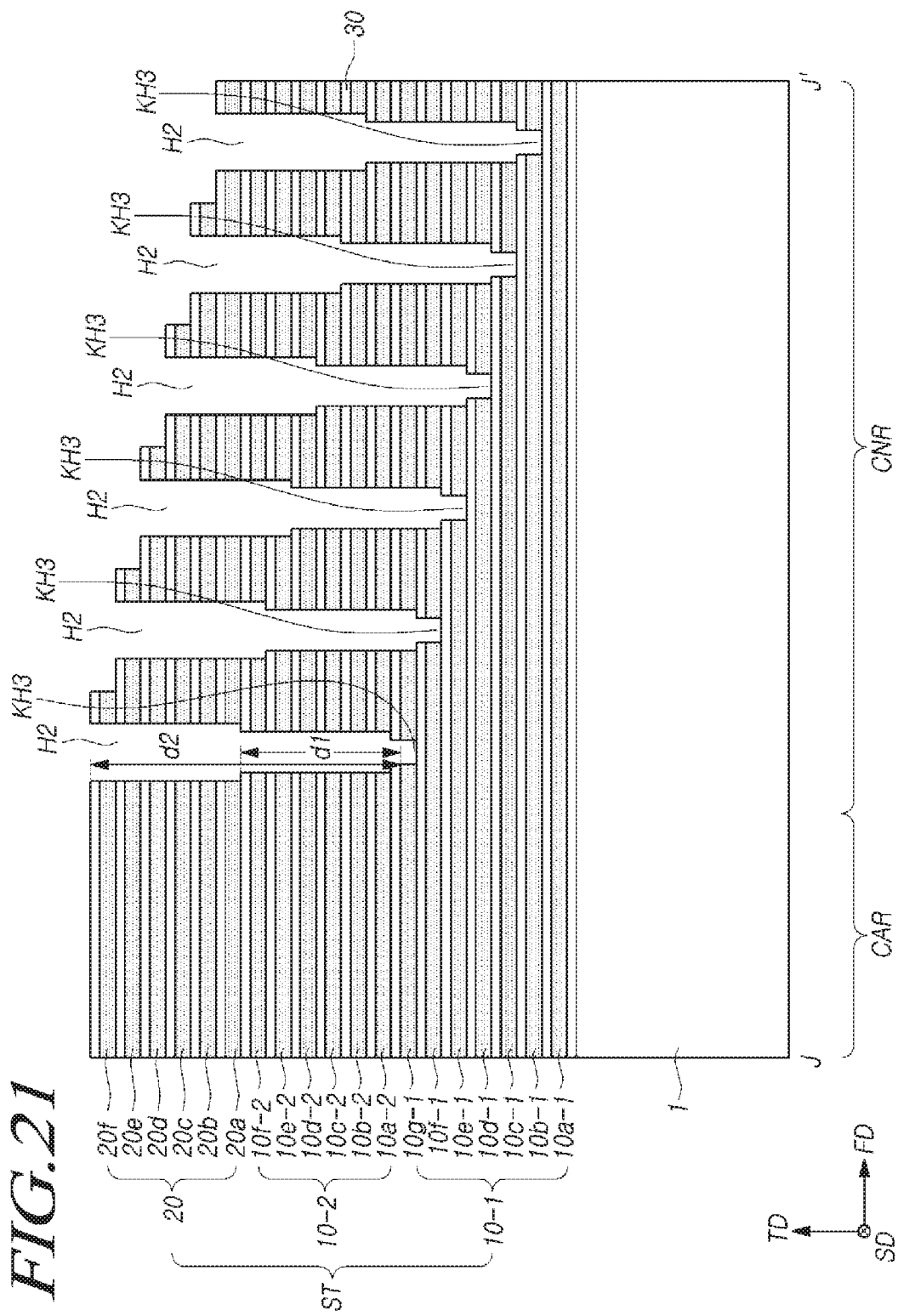
FIG. 21 is a cross-sectional view taken along the line J-J' of FIG. 19.

FIG. 19 is a top view illustrating a representation of an example of a semiconductor memory device in accordance with an embodiment of the disclosure, FIG. 20 is a cross-sectional view taken along the line I-I' of FIG. 19, and FIG. 21 is a cross-sectional view taken along the line J-J' of FIG. 19.

Referring to FIGS. 19 to 21, an electrode structure ST may include a plurality of bottom electrode structures 10-1 and 10-2 and a top electrode structure 20 which are stacked on a substrate 1. It is illustrated in the described embodiment that two (2) bottom electrode structures are included in the electrode structure ST. In the following descriptions, for the sake of convenience in explanation, the bottom electrode structure denoted by the reference symbol 10-1 will be defined as a first bottom electrode structure, and the bottom electrode structure denoted by the reference symbol 10-2 will be defined as a second bottom electrode structure.

The first bottom electrode structure 10-1 may be disposed on the substrate 1, and may include a plurality of first bottom electrodes 10a-1 to 10g-1 which are stacked to be separated from one another in the third direction TD. The second bottom electrode structure 10-2 may be disposed on the first bottom electrode structure 10-1, and may include a plurality of second bottom electrodes 10a-2 to 10f-2 which are stacked to be separated from one another in the third direction TD. The top electrode structure 20 may be disposed on the second bottom electrode structure 10-2, and may include a plurality of top electrodes 20a to 20f which are stacked to be separated from one another in the third direction TD. Interlayer dielectric layers 30 may be disposed on and under the first bottom electrodes 10a-1 to 10g-1, the second bottom electrodes 10a-2 to 10f-2 and the top electrodes 20a to 20f. The first bottom electrode structure 10-1 may include the plurality of first bottom electrodes 10a-1 to 10g-1 and a plurality of interlayer dielectric layers 30 which are alternately stacked in the third direction TD. The second bottom electrode structure 10-2 may include the plurality of second bottom electrodes 10a-2 to 10f-2 and a plurality of interlayer dielectric layers 30 which are alternately stacked in the third direction TD. The top electrode structure 20 may include the plurality of top electrodes 20a to 20f and a plurality of interlayer dielectric layers 30 which are alternately stacked in the third direction TD.

The top electrode structure 20 may have a stepped structure which is formed by top pad regions P1 of the top electrodes 20a to 20f, in a connection region CNR. Each of the top pad regions P1 of the top electrodes 20a to 20f may be covered by a corresponding interlayer dielectric layer 30 positioned thereon. The top surfaces of the interlayer dielectric layers 30 which cover the top pad regions P1 may provide the stepping surfaces of the stepped structure.

In the connection region CNR, the first bottom electrode structure 10-1 and the second bottom electrode structure 10-2 may have a non-stepped structure.

A plurality of first recess holes H1 which are formed to the same first depth d1 from the stepping surfaces of the top electrode structure 20 and have bottom surfaces exposing the second bottom electrode structure 10-2 may be defined. The first depth d1 may be the same or substantially the same as the height of the top electrode structure 20.

The first recess holes H1 may be formed all at once by a single etching process using a single mask. Since the first recess holes H1 are formed to the same first depth d1 from the stepping surfaces of the top electrode structure 20 which are disposed at vertically different positions, the distances of the bottom surfaces of the first recess holes H1 from the substrate 1 may be different from one another. In the present embodiment, the bottom surfaces of the first recess holes H1 may be disposed closer to the substrate 1 as the distances thereof from a cell array region CAR increase. At the bottoms of the first recess holes H1, the second bottom electrodes 10a-2 to 10f-2 may have second bottom pad regions which are exposed by the top electrodes 20a to 20f and one or more second bottom electrodes positioned thereon.

A plurality of second recess holes H2 which are formed to the same second depth d2 from the stepping surfaces of the top electrode structure 20 and have bottom surfaces exposing the first bottom electrode structure 10-1 may be defined. The second depth d2 may be the same or substantially the same as the summed size of the height of the top electrode structure 20 and the height of the second bottom electrode structure 10-2.

The second recess holes H2 may be formed by primarily etching second recess hole forming portions to the first depth d1 in an etching process for forming the first recess holes H1 and then additionally etching primarily etched portions and the surrounding portions thereof. Due to this feature in processing, based on a position spaced apart by the first depth d1 from the bottom surface of each of the second recess holes H2, the diameter of a lower portion thereof may be smaller than the diameter of an upper portion thereof.

Since the second recess holes H2 are formed to the same second depth d2 from the stepping surfaces of the top electrode structure 20 which are disposed at vertically different positions, the bottom surfaces of the second recess holes H2 may be disposed at vertically different positions. In the present embodiment, the bottom surfaces of the second recess holes H2 may be disposed closer to the substrate 1 as the distances thereof from the cell array region CAR increase. At the bottoms of the second recess holes H2, the first bottom electrodes 10a-1 to 10f-1 may have first bottom pad regions which are exposed by the top electrodes 20a to 20f, the second bottom electrodes 10a-2 to 10f-2 and one or more first bottom electrodes positioned thereon.

In the stepping surfaces of the top electrode structure 20, there may be formed a plurality of first key grooves KH1 which penetrate the top electrode structure 20 by a predetermined depth in the third direction TD. Each of the first key grooves KH1 may vertically pass through each interlayer dielectric layer 30 providing each stepping surface and each of the top electrodes 20a to 20f lying thereunder. That is to say, the depth of each first key groove KH1 may correspond to the vertical pitch of the top electrodes 20a to 20f.

A plurality of second key grooves KH2 may be formed at the bottoms of the first recess holes H1, respectively. Each second key groove KH2 may penetrate the second bottom electrode structure 10-2 by a predetermined depth in the third direction TD at the bottom of each first recess hole H1. Each of the second key grooves KH2 may vertically pass through each interlayer dielectric layer 30 exposed by each first recess hole H1 and each of the second bottom electrodes 10f-2 to 10a-2 lying thereunder. The depth of each second key groove KH2 may correspond to the vertical pitch of the second bottom electrodes 10f-2 to 10a-2. When viewed from the top, the diameter of each second key groove KH2 may be smaller than the diameter of each first recess hole H1, and may be the same or substantially the same as the diameter of each first key groove KH1.

A plurality of third key grooves KH3 may be formed at the bottoms of the second recess holes H2, respectively. Each third key groove KH3 may penetrate the first bottom electrode structure 10-1 by a predetermined depth in the third direction TD at the bottom of each second recess hole H2. Each of the third key grooves KH3 may vertically pass through each interlayer dielectric layer 30 exposed by each second recess hole H2 and each of the first bottom electrodes 10b-1 to 10g-1 lying thereunder. The depth of each third key groove KH3 may correspond to the vertical pitch of the first bottom electrodes 10b-1 to 10g-1. When viewed from the top, the diameter of each third key groove KH3 may be smaller than the diameter of each second recess hole H2, and may be the same or substantially the same as the diameter of each first key groove KH1.

When viewed from the top, at least one first recess hole H1, at least one second recess hole H2 and at least one first key groove KH1 may be disposed in each top pad region P1. It is illustrated in the embodiment shown in the drawing that one first recess hole H1, one second recess hole H2 and one first key groove KH1 are disposed in each top pad region P1. Each first key groove KH1, each first recess hole H1 and each second recess hole H2 which are disposed in the same top pad region P1 may be disposed in a line in the second direction SD.

Hereafter, the effects of the disclosure will be described with reference to FIGS. 22 and 23.

Figure 22:
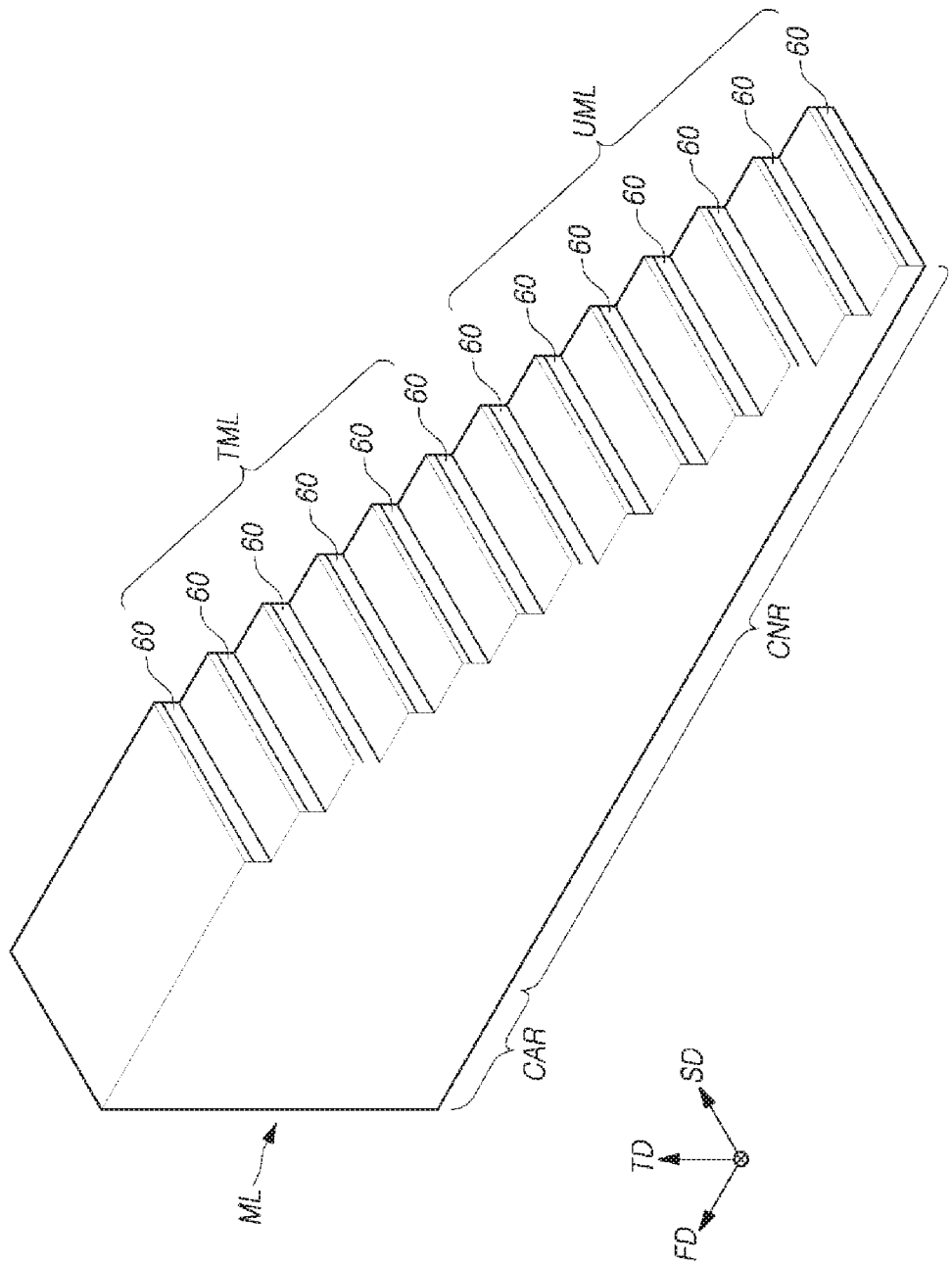
FIGS. 22 and 23 are perspective views illustrating representations of examples of semiconductor memory devices related with the disclosure.
Figure 23:
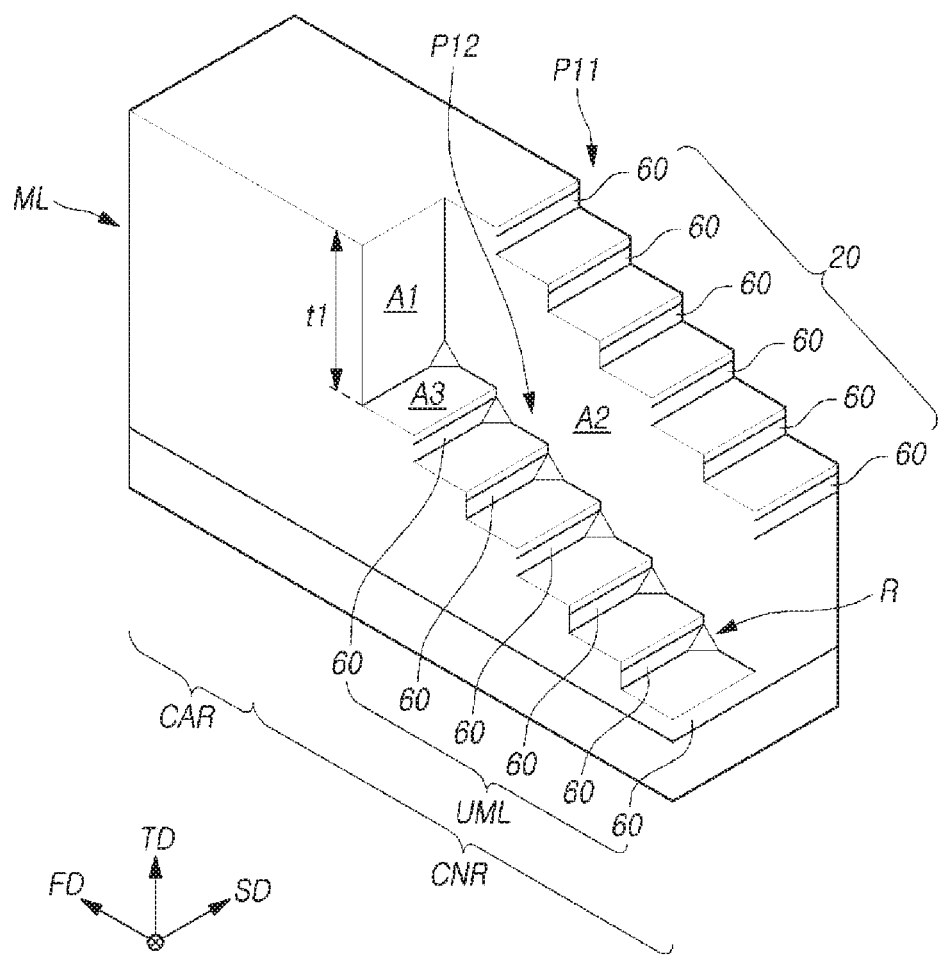

FIGS. 22 and 23 are perspective views illustrating representations of examples of semiconductor memory devices related with the disclosure.

Referring to FIG. 22, in order to define pad regions for connection with contact plugs, a stepped structure may be formed in a top stack TML and a bottom stack UML of a connection region CNR in the first direction FD. In this case, the length, in the first direction FD, of a pre-stack ML in the connection region CNR may have a substantially large value as the summed value of the length of the stepped structure of the top stack TML in the first direction FD and the length of the stepped structure of the bottom stack UML in the first direction FD. Accordingly, the semiconductor memory device will have a long length in the first direction FD.

Referring to FIG. 23, after forming a first stepped structure P11 in a top stack TML in the first direction FD, by forming a mask pattern (not shown) exposing a partial width of the first stepped structure P11 in the second direction SD and etching the top stack TML and a bottom stack UML by a predetermined thickness through using the mask pattern as an etch mask, a second stepped structure P12 may be formed in the bottom stack UML. In this case, since the first stepped structure P11 of the top stack TML and the second stepped structure P12 of the bottom stack UML are disposed in the second direction SD, the length of a pre-stack ML in the first direction FD in a connection region CNR may be reduced to half in comparison with FIG. 22. However, because the amount of a material to be etched in an etching process for forming the second stepped structure P12 is substantial, an etch loading is substantially large, and due to this fact, a slope may occur on an etched surface during the etching process. Such a slope may occur unevenly and irregularly region by region. Due to the presence of the slope, an insulative etching residue R may be generated in the vicinity of a triple point where an etched surface A1 in the first direction FD, an etched surface A2 in the second direction SD and a bottom surface A3 meet.

While not shown, after forming the second stepped structure P12, bottom electrodes and top electrodes should be formed by removing first material layers 60 which are used as sacrificial layers and filling a conductive material in spaces which are formed by the removal of the first material layers 60. In this regard, the conductive material may remain where the insulative etching residue R is present, and thus, an unwanted conductive pattern may be formed. Due to the presence of the conductive pattern, a short failure in which the top and bottom electrodes are connected with each other may occur.

According to the embodiments of the disclosure, by etching the top stack TML into the stepped structure and etching the top stack TML and the bottom stack UML by a predetermined depth from the stepping surfaces of the stepped structure, pad regions may be defined in such a way as to form recess holes having bottom surfaces which expose the bottom stack UML.

Therefore, since it is not necessary to form a stepped structure in the bottom stack UML, the lengths, in the first direction FD, of the pre-stack ML and the electrode structure ST formed using the same may be reduced, whereby it is possible to reduce the size of the semiconductor memory device. Moreover, since it is sufficient to form the stepped structure only in the first direction FD, it is possible to prevent the occurrence of a failure that occurs in the case where the stepped structure is formed in the first direction FD and the second direction SD (see FIG. 23), that is, a short failure in which an unwanted conductive pattern is generated in the vicinity of a triple point where an etched surface in the first direction FD, an etched surface in the second direction SD and a bottom surface meet and top and bottom electrodes are connected with each other due to the presence of the conductive pattern.

Figure 24:
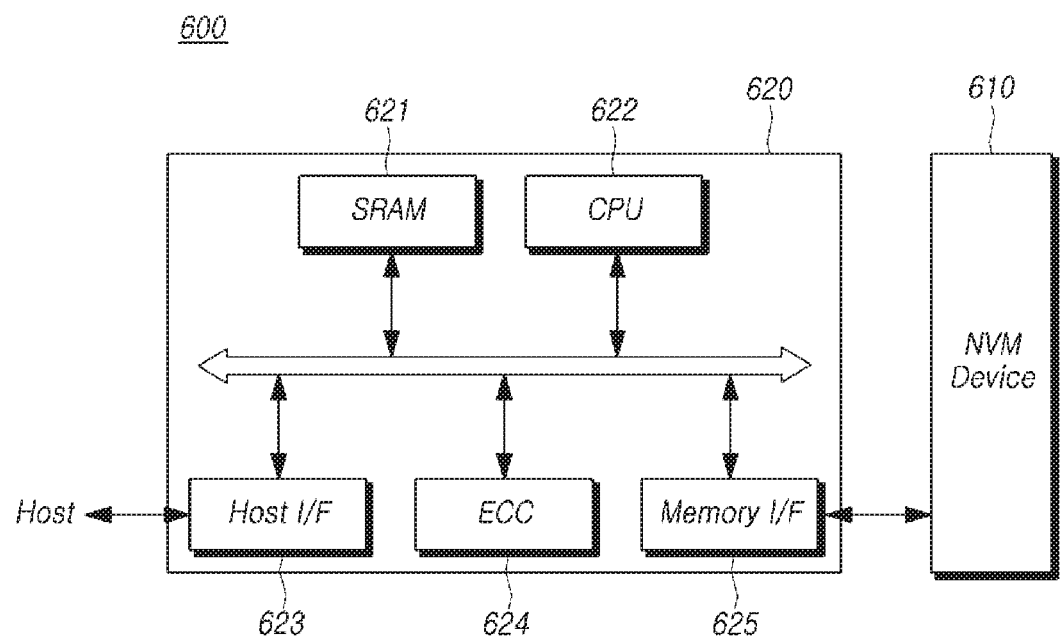
FIG. 24 is a block diagram schematically illustrating a representation of an example of a memory system including the semiconductor memory device in accordance with the embodiments of the disclosure.

FIG. 24 is a simplified block diagram schematically illustrating a memory system including a semiconductor memory device according to an embodiment of the present invention.

Referring to FIG. 24, the memory system 600 may include the nonvolatile memory device 610 and a memory controller 620.

The nonvolatile memory device 610 may comprise the semiconductor memory device according to an embodiment of the invention as described above, and may be operated in the manner described above. The memory controller 620 may control the nonvolatile memory device 610. For example, the combination of the nonvolatile memory device 610 and the memory controller 620, may be configured as a memory card or a solid state disk (SSD). The memory controller 620 may include an SRAM 621, a central processing unit (CPU) 622, a host interface 623, an error correction circuit (ECC) block 624, a memory interface 625.

The SRAM 621 may be used as the working memory of the CPU 622. The host interface 623 may include the data exchange protocol of a host which may be coupled with the memory system 600.

The ECC block 624 may detect and correct an error included in the data read out from the nonvolatile memory device 610.

The memory interface 625 may interface with the nonvolatile memory device 610. The CPU 622 may perform general control operations for data exchange of the memory controller 620.

Although not shown, it should become apparent to a person skilled in the art that the memory system 600 may further be provided with a ROM which stores code data for interfacing with the host. The nonvolatile memory device 610 may be provided as a multi-chip package constructed by a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCIe (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 25:
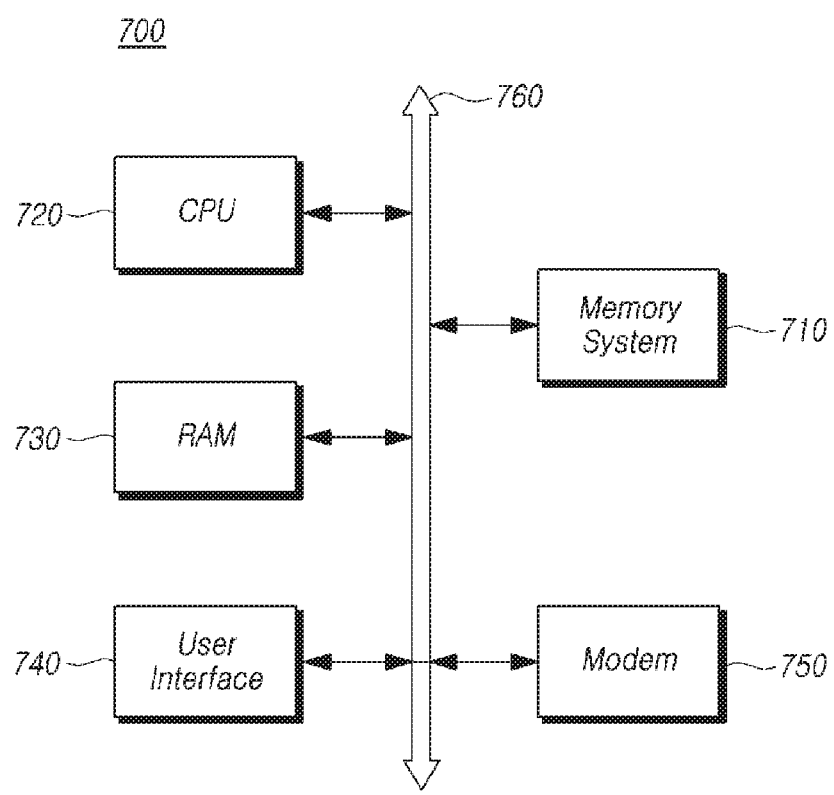
FIG. 25 is a block diagram schematically illustrating a computing system including the semiconductor memory device in accordance with the embodiments of the disclosure.

FIG. 25 is a simplified block diagram schematically illustrating a computing system including a semiconductor memory device, according to an embodiment of the present invention.

Referring to FIG. 25, a computing system 700 according to an embodiment may include a memory system 710, a microprocessor (or CPU) 720, a RAM 730, a user interface 740, a modem 750 such as a baseband chipset, all of which may be electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also, as an example, the memory system 710 may be provided as a fusion flash memory (for example, a NAND or a NOR flash memory).

While various embodiments have been described above, it will be understood to those skilled in the art that the embodiments described are by way of example only. Accordingly, the semiconductor memory device described herein should not be limited based on the described embodiments.

For example, while the recess holes H1, the first, second and third key grooves KH1, KH2, KH3 and the first and second contact plugs CP1, CP2 are shown to have a circular cross-section, the inventive concepts of the present disclosure are not limited in this way and other shapes may be employed without departing from the scope of the invention. It should be further understood that the sequence of the various steps of the described method for making disclosed embodiments may be modified as it may be apparent to those with ordinary skill in the art of the present invention to the extent that such modifications do not fall outside the scope of the present invention. Also, one or more features described in reference with one embodiment may be employed with another embodiment to the extent that such modifications do not fall outside the scope of the present invention.

What is claimed is:

1. A semiconductor memory device comprising:
    a substrate including a cell array region and a connection region extending in a first direction from the cell array region;
    an electrode structure including a bottom electrode structure which includes a plurality of bottom electrodes stacked on the substrate to be separated from one another and a top electrode structure which includes a plurality of top electrodes stacked on the bottom electrode structure to be separated from one another and has a stepped structure which includes a plurality of stepping surfaces, in the connection region; and
    a plurality of recess holes formed to a first depth from the stepping surfaces, and having bottom surfaces which expose the bottom electrode structure,
    wherein the first depth is substantially the same as a height of the top electrode structure, and distances of the bottom surfaces of the recess holes from the substrate are different from one another.

2. The semiconductor memory device according to claim 1,
wherein each of the top electrodes includes a top pad region which is exposed by another top electrode positioned thereon, and
wherein each of the bottom electrodes includes a bottom pad region which is exposed by the top electrodes and one or more bottom electrodes positioned thereon, under each of the recess holes.

3. The semiconductor memory device according to claim 1, wherein the stepping surfaces of the stepped structure are disposed closer to the substrate as distances thereof from the cell array region in the first direction increase.

4. The semiconductor memory device according to claim 3, wherein the bottom surfaces of the recess holes are disposed closer to the substrate as distances thereof from the cell array region in the first direction increase.

5. The semiconductor memory device according to claim 1, wherein the stepped structure has a step height corresponding to a vertical pitch of the top electrodes.

6. The semiconductor memory device according to claim 1, further comprising:
first key grooves vertically penetrating the top electrode structure from the stepping surfaces.

7. The semiconductor memory device according to claim 6, wherein the first key grooves have a depth corresponding to the vertical pitch of the top electrodes.

8. The semiconductor memory device according to claim 6, wherein at least one recess hole and at least one first key groove which are formed in the same stepping surface are disposed to be separated in a second direction, and the second direction is a direction parallel to the substrate intersecting with the first direction.

9. The semiconductor memory device according to claim 1, further comprising:
second key grooves formed at bottoms of the recess holes and vertically penetrating the bottom electrode structure from the bottom surfaces of the recess holes.

10. The semiconductor memory device according to claim 9, wherein the second key grooves have a depth corresponding to a vertical pitch of the bottom electrodes.

11. The semiconductor memory device according to claim 1, wherein the bottom electrode structure has a non-stepped structure in the connection region.

12. The semiconductor memory device according to claim 1, wherein the recess holes are disposed in a zigzag pattern in the first direction.

13. A semiconductor memory device comprising:
a substrate defined with a cell array region and a connection region which extends in a first direction from the cell array region;
a first bottom electrode structure including a plurality of first bottom electrodes which are stacked on the substrate to be separated from one another;
a second bottom electrode structure including a plurality of second bottom electrodes which are stacked on the first bottom electrode structure to be separated from one another;
a top electrode structure including a plurality of top electrodes which are stacked on the second bottom electrode structure to be separated from one another, and having a stepped structure which includes a plurality of stepping surfaces, in the connection region;
a plurality of first recess holes formed to a first depth from the stepping surfaces, and having bottom surfaces which expose the second bottom electrode structure; and
a plurality of second recess holes formed to a second depth from the stepping surfaces, and having bottom surfaces which expose the first bottom electrode structure,
wherein the first depth is the substantially same as a height of the top electrode structure, the second depth is substantially equal to sum of the height of the top electrode structure and a height of the second bottom electrode structure, and distances of bottom surfaces of the first and second recess holes from the substrate are different from one another.

14. The semiconductor memory device according to claim 13,
wherein each of the top electrodes includes a top pad region which is exposed by another top electrode positioned thereon,
wherein each of the second bottom electrodes includes a first bottom pad region which is exposed by the top electrodes and one or more second bottom electrodes positioned thereon, under each of the first recess holes, and
wherein each of the first bottom electrodes includes a second bottom pad region which is exposed by the top electrodes, the second bottom electrodes and one or more first bottom electrodes positioned thereon, under each of the second recess holes.

15. The semiconductor memory device according to claim 13, wherein, based on a position spaced apart by the first depth from a bottom surface of each second recess hole, a diameter of a lower portion thereof is smaller than a diameter of an upper portion thereof.

16. The semiconductor memory device according to claim 13, wherein the first and second bottom electrode structures have a non-stepped structure in the connection region.

17. The semiconductor memory device according to claim 13, wherein the stepped structure has a step height corresponding to a vertical pitch of the top electrodes.

18. The semiconductor memory device according to claim 13, wherein at least one first recess hole, at least one second recess hole and at least one first key groove which are formed in the same stepping surface are disposed to be separated in a second direction, and the second direction is a direction that intersects with the first direction on a plane parallel to the substrate.

* * * * *